(12) United States Patent
Laibinis et al.

(10) Patent No.: US 6,284,317 B1
(45) Date of Patent: Sep. 4, 2001

(54) DERIVATIZATION OF SILICON SURFACES

(75) Inventors: Paul E. Laibinis, Medford; Namyong Y. Kim, Cambridge, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/293,258

(22) Filed: Apr. 16, 1999

Related U.S. Application Data

(60) Provisional application No. 60/082,197, filed on Apr. 17, 1998.

(51) Int. Cl.[7] ............................. B05D 5/12; H01L 21/20; C01B 33/04
(52) U.S. Cl. .................. 427/258; 427/126.1; 427/261; 427/265; 427/307; 427/314; 427/383.1; 427/383.3; 427/384; 427/385.5; 427/419.8; 428/304.4; 428/307.3; 428/312.2; 428/312.6; 428/373.9; 428/457; 428/543; 423/347; 502/407; 438/584
(58) Field of Search ..................................... 427/258, 261, 427/265, 307, 314, 384, 385.5, 126.1, 383.1, 383.3, 417.8; 428/457, 304.4, 307.3, 312.2, 312.6, 313.9, 543; 423/347; 502/407; 438/584

(56) References Cited

U.S. PATENT DOCUMENTS

| | | | |
|---|---|---|---|
| 2,721,812 | * 10/1955 | Iler . | |
| 5,017,540 | * 5/1991 | Sandoval et al. | 502/158 |
| 5,326,738 | * 7/1994 | Sandoval et al. | 502/401 |
| 5,908,692 | * 6/1999 | Hamers et al. | 428/333 |
| 6,132,801 | * 10/2000 | Linford | 427/221 |

OTHER PUBLICATIONS

Simon et al., "Synthesis and Characterization of a New Surface Derivatizing Reagent to Promote the Adhesion of Polyryrrole Films to n–Type Silicon Photoanodes N–(3–Trimethoxysilyl)propyl)pyrrole," *J. Am. Chem. Soc.*, 1982, 104, 2031–2034.

Willicut and McCarley, "Surface–Confined Monomers on Electrode Surfaces. 1. Electrochemical and Microscopic Characterization of ω–(N–Pyrrolyl)alkanethiol Self–Assembled Monolayers on Au," *Langmuir*, 1995, 11, 296–301.

Sayre and Collard, "Self–Assembled Monolayers of Pyrrole–Containing Alkanethiols on Gold," *Langmuir*, 1995, 11, 302–306.

Rubinstein et al., "Morphology Control in Electrochemically Grown Conducting Polymer Films. 1. Precoating The Metal Substrate with an Organic Monolayer," *J . Am. Chem. Soc.*, 1990, 112, 6135–6136.

* cited by examiner

*Primary Examiner*—Robert Dawson
*Assistant Examiner*—Jeffrey B. Robertson
(74) *Attorney, Agent, or Firm*—Wolf, Greenfield, & Sacks, P.C.

(57) ABSTRACT

The present invention relates to methods of derivatizing semiconductor surfaces, particularly porous silicon surfaces with silicon-carbon units. The derivatization occurs through the direct addition of an organometallic reagent in the absence of an external energy source such as heat and photo- or electrochemical energies. The method of the invention allows the formation of unique intermediates including silicon hydride units bonded to metal ions. Because of these unique intermediates, it is possible to form previously inaccessible silicon-carbon units, for example where the carbon atom is an unsaturated carbon atom. Such inaccessible silicon-carbon units also include silicon-polymer covalent bond formation, in particular where the polymer is a conducting polymer. Thus, the present invention also provides a novel semiconductor surface/polymer junction having improved interfacial interactions.

21 Claims, 14 Drawing Sheets

DERIVATIZATION OF SILICON SURFACES

RELATED APPLICATIONS

This non-provisional application claims the benefit under Title 35, U.S.C. §119(e) of co-pending U.S. provisional application Ser. No. 60/082,197, filed Apr. 17, 1998, entitled "Derivatization of Silicon Surfaces" by Paul E. Laibinis et al., incorporated herein by reference.

This invention was made with government support under Grant Number N00014-96-10759 awarded by the Department of the Navy. The government has certain rights in the invention.

FIELD OF THE INVENTION

The present invention relates to methods for derivatizing silicon-hydride terminated surfaces to form silicon-carbon bonds through the addition of organometallic reagents, and articles having surfaces containing silicon-carbon bonds where the carbon is part of a unit containing at least one unsaturated carbon atom. The present invention also relates to articles covalently attached to a polymer, in particular where the article is a semiconductor surface such as silicon.

BACKGROUND OF THE INVENTION

The highly reactive nature of single-element semiconductor surfaces, namely silicon surfaces, creates a continuing need and challenge for controlled derivatization of these surfaces. Such processes should be adaptable for automated production and thus should include features such as ease of chemical derivatization and low process costs. Moreover, any electronic or other chemical features of an article having a derivatized surface should be maintained after derivatization. For example, there is a heightened interest in porous silicon due to its luminescent properties, and promise of compatibility with current semiconductor fabrication schemes based on silicon. Thus, there is a need for facile methods for derivatizing this surface.

The formation of Group IV element surfaces covalently terminated with organic groups is one desired derivatization process, e.g., a surface having silicon-carbon bonds. Silicon-carbon bonds can be accessed through hydrogen-terminated surfaces (i.e., having silicon-hydride bonds). Typically, however, substitution of silicon-hydride bonds with silicon-carbon bonds requires intermediate process steps prior to addition of the carbon-containing reagent. In at least one known case, a chlorination pretreatment step is required at temperatures of at least 80° C. prior to silicon-carbon bond formation. The resulting chlorinated silicon surface is more sensitive to water and is not as easily manipulated compared to silicon-hydride surfaces. Other techniques for the formation of silicon-methyl surfaces are carried out through the addition of a Grignard reagent, $CH_3MgBr$ but only in the presence of a photo- or electrochemical stimulus.

In other applications, there remains a challenge to provide an intimate integration between semiconductors and conducting polymers for efficient electrical and optical coupling. Conducting polymers offer distinct advantages over other conducting materials in that the physical properties can be tailored in a relatively facile manner. Thus, unlike conventional metal/semiconductor contacts, the electrical properties can be manipulated through various parameters such as polymer type and dopant.

Typically, forming polymer/semiconductor junctions involves depositing the polymer on the semiconductor by spin-coating or electrochemical polymerization. In general, a high quality junction cannot be obtained by such traditional deposition techniques. The resulting junction often suffers from poor interfacial interactions that can diminish physical and electrical performance.

Other junctions have been formed with an intervening oxide layer. Simon et al. report an oxidized surface of silicon attached to a pyrrole-terminated alkylsiloxane monolayer via an oxide linkage and subsequently subjected to polymerization. The intervening oxide layer optimizes electrical and other physical properties of the polymer/semiconductor junction.

There remains a challenge to derivatize surfaces with various organic groups, in particular where the surface comprises a Group IV semiconductor. There also remains a need to lower costs for forming surfaces having silicon-carbon bonds.

SUMMARY OF THE INVENTION

The present invention provides methods for the derivatization of hydride-terminated surfaces that can be performed free of external energy sources to provide these methods with lower production costs and ease of use. Moreover, the methods allow the formation of Group IV element carbon bonds where the carbon is attached to a wide variety of units, such as polymers to provide polymer-modified surfaces.

One aspect of the present invention provides a method for forming a surface having a silicon-carbon bond. At least a portion of the surface comprises $Si_xH_y$ units where H is bonded to Si, x is greater than zero and y is greater than zero. A silicon-carbon bond is formed on the at least a portion of the surface at a temperature of less than about 25° C. free of an external energy source.

Another aspect of the present invention provides a method for forming a surface having at least a portion of the surface comprising a formula $Si_xH_y$. H is bonded to Si, x is greater than zero and y is greater than zero. The at least a portion of the surface is exposed to an organometallic reagent to form a silicon-metal bond on the at least a portion of the surface.

Another aspect of the present invention provides an article. The article has a surface having at least a portion of the surface comprising a formula $Si_xH_y$—$MX_n$. M is a metal, H is bonded to Si, x is greater than zero, y is greater than zero, X is an anion and n is at least 0.

Another aspect of the present invention provides an article having a surface where at least a portion of the surface has a silicon-carbon bond. A carbon atom of the silicon-carbon bond is attached to a unit having at least one unsaturated carbon atom.

Another aspect of the present invention provides an article comprising a semiconductor material. A surface of the article is hydrogen-terminated and covalently attached to a polymer.

Another aspect of the present invention provides an article comprising a semiconductor material. A surface of the article is substantially free of oxidation and is covalently attached to a polymer.

Another aspect of the present invention provides a method for covalently attaching a polymer to a surface. The method involves providing a hydrogen-terminated surface and reacting the surface with a reagent where the reagent includes a reactive functional group. A polymer is then deposited on the surface.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

Figure 1:
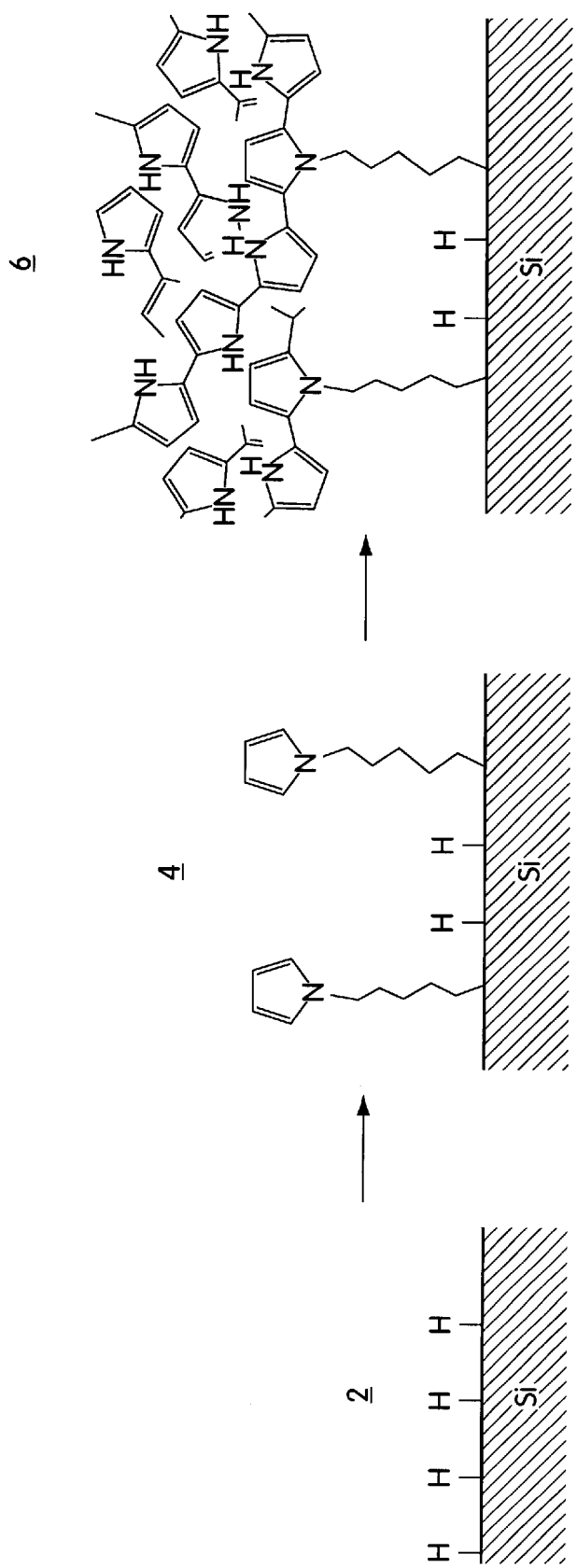
FIG. 1 shows a schematic representation of the derivatization of a silicon surface with a pyrrole-terminated group and subsequently a polymer.

The present invention involves derivatization of a semiconductor surface with a variety of organic groups, where the derivatization can occur in a facile manner, i.e., in the absence of external energy sources. In particular, the present invention relates to methods for derivatizing hydrogen-terminated surfaces. The derivatization can also lead to the ability to provide polymer-terminated surfaces, where the surface is covalently attached to the polymer. Where the surface is a semiconductor surface, this method allows the provision of a covalent contact between semiconductor surfaces such as silicon surfaces and polymers and, in particular, conducting polymers. Two important classes of articles having hydrogen-terminated surfaces that are derivatized in accordance with the invention are crystalline silicon and porous silicon. Typical methods to produce Si—H bonds involve exposing crystalline silicon to HF.

The method of the present invention is particularly advantageous because a hydrogen-terminated silicon surface can be directly derivatized with silicon-carbon bonds. One aspect of the invention provides a method involving a surface where at least a portion of the surface comprises $Si_xH_y$ units, where $Si_xH_y$ is a formula representing a silicon-hydrogen-terminated surface, i.e., silicon is directly bonded to hydrogen, x is greater than zero and y is greater than zero. The surface may be the surface of an article and the remaining portion of the article, or the bulk of the article, can have silicon-silicon bonds.

One step of the method can involve the addition of an organometallic reagent to the $Si_xH_y$ units. An "organometallic reagent" is defined as a compound having at least one metal-carbon bond. The metal can be selected from the group consisting of alkali metals, alkaline earth metals, main group metals, transition metals, lanthanides and actinides. In a preferred embodiment, the metal is selected from the group consisting of lithium, magnesium, copper and zinc. In another preferred embodiment, the organometallic reagent is a Grignard reagent where the metal is magnesium. In yet another preferred embodiment, the organometallic reagent is an organolithium or an organocuprate reagent. Adding the organometallic reagent can result in the formation of silicon-carbon bonds on at least a portion of the surface. The addition can be performed at a temperature of less than about 25° C. in the absence of an external energy source. As used herein, "external energy" includes energy applied to a chemical reaction other than typical room temperature heat and lighting conditions, such as photochemical energy, electrochemical energy, sonication, excessive heat, other radiation, and the like. In other embodiments, addition of the organometallic reagent can be performed under mild heating conditions, i.e. a temperature of less than about 100° C., to increase a rate of silicon-carbon bond formation or the number of silicon-carbon bonds formed in a given time period.

The formation of Si—C bonds can be characterized by a variety of methods known to one of ordinary skill in the art (e.g. diffuse reflectance infrared Fourier transform spectroscopy (DRIFT) and X-ray photoelectron spectroscopy (XPS)). In addition, derivatized surfaces exhibit very little change in their spectroscopic features upon exposure to non-ambient conditions such as ultra high vacuum, HF (aqueous) in ethanol, or sonification in an organic solvent such as toluene. The stability of these derivatized-surfaces under such conditions supports the formation of a robust, covalent attachment to the surface.

In one embodiment, addition of the organometallic reagent results in the formation of a silicon-metal bond on at least a portion of the surface. In one embodiment, a metal atom of the silicon-metal bond is provided from the organometallic reagent. The silicon-metal bond can be substituted with silicon-carbon bond by the addition of an organic halide. An "organic halide" refers to any organic compound having a reactive halide. In one embodiment, the organic halide has a formula $C_xH_yO_zX$, where x is at least 1, y is at least 1, z is at least zero, and X is a halide selected from the group consisting of fluoride, chloride, bromide and iodide. In a preferred embodiment, the organic halide is an organic acid halide (acyl halide). Examples of organic acid halides include acyl halides such as acetyl chloride and undecenoyl chloride. The organic halide may include a unit having at least one unsaturated carbon atom. An "unsaturated carbon atom" is defined as a carbon having at least one p-orbital involved in π-bonding. The unsaturated carbon atom can be selected from the group consisting of alkenes, alkynes and aryls. Because typical prior art methods for forming silicon-carbon bonds on surfaces do not provide the possibility of forming a wide variety of carbon-containing groups, it is a feature of the present invention that the presence of silicon-metal bonds allow the addition of a variety of organic groups by the addition of reagents such as organometallic reagents and/or organic halides.

Another aspect of the present invention provides an article having a surface where at least a portion of the surface has a silicon-carbon bond. In particular, a carbon atom of the silicon-carbon bond is attached to a unit having at least one unsaturated carbon atom.

Another aspect of the invention provides an article having a surface where at least a portion of the surface has a silicon-metal bond. As mentioned previously, silicon-metal bonds can result by adding an organometallic reagent to a silicon-hydride terminated surface. The metal may also be bonded to an anion such that at least a portion of the surface has a formula $Si_xH_y$—$MX_n$, where x is greater than zero, y is greater than zero, X is an anion and n is at least zero.

While not wishing to be bound by any theory, it is believed that the mechanism of the formation of silicon-carbon bonds from a hydrogen-terminated surface proceeds as shown in equations 1–3:

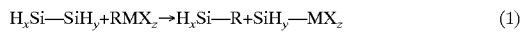  (1)

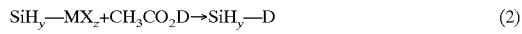  (2)

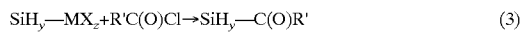  (3)

"M" can be any metal as described previously, and "$X_z$" refers to any halide as described previously where z is at least zero. From this proposed mechanism, the reaction proceeds through a novel silicon-metal-terminated species. This mechanism appears to be supported by experiments where a reaction between porous silicon and a deuterated carboxylic acid, e.g., $CH_3CO_2D$, does not result in any observable Si—D species. A Si—D species, however, can be generated by reacting the porous silicon with the organometallic reagent, followed by reaction with the deuterated carboxylic acid (see Example 5).

Another advantageous feature of the present invention is the ability to derivatize surfaces with a wide variety of organic groups, in particular polymers and preferably, conducting polymers. Conducting polymers offer an attractive tailorability for use in various electronic and photonic applications, and polymers generally offer ease in machining and other fabrication processes. The present invention allows integration of conducting polymers with semiconductors via intimate contact between the polymer and the semiconductors surface, where the intimate contact is provided as a covalent bond. Charge transfer characteristics across a semiconductor/polymer junction largely control electrical properties of the junction. In heterojunctions, such as a junction between an inorganic semiconductor and an organic conducting polymer film, there is a discontinuity in the conduction mechanism and often a weak interaction between these two phases. To replace traditional metal components with polymeric films, achieving intimate contact between the phases is required for these new materials to be useful in practical applications.

Thus, one aspect of the present invention provides an article comprising a semiconductor material having a surface which is hydrogen-terminated and covalently attached to a polymer. An example of a hydrogen-terminated surface is a porous silicon surface as described previously. In one embodiment, the semiconductor comprises a Group IV element and preferably a Group IV element selected from the group consisting of silicon and germanium.

In one embodiment, the polymer is a conducting polymer. Physical properties of conducting polymers, such as conductivity, can be varied by chemical manipulation of the polymer. A "conducting polymer" refers to any polymer having a resistivity of less than about $10^2$ ohm-cm and more preferably still less than about $10^4$ ohm-cm. Various conducting polymers are well-known in the art. In one embodiment, the conducting polymer selected from the group consisting of polypyrroles, polythiophenes, polyanilines, polyacetylenes and derivatives thereof.

Another advantageous feature of the present invention allows the formation of a semiconductor surface/polymer junction, where an interface of the junction is free of substituents that can result in deleterious effects to this junction. Any intervening material located in the interface between the semiconductor surface and the polymer can decrease the extent of interaction between the semiconductor and the polymer.

Thus, one aspect of the present invention provides an article comprising a semiconductor material, a surface of which is substantially free of oxidation and is covalently attached to a polymer. A "surface substantially free of oxidation" generally refers to a surface that does not contain an oxide. In one embodiment, the surface is free of attachment to an oxygen atom, i.e., the surface is not bonded to oxygen. One of ordinary skill in the art can determine when a surface covalently attached to a polymer is substantially free of oxidation. Such methods include various surface characterization techniques such as IR spectroscopy (diffuse reflectance infrared Fourier transform spectroscopy, DRIFT) and X-ray photoelectron spectroscopy (XPS). "Substantially free" would also encompass the observance of minute quantities of oxide species, preferably less than a few monolayers of oxide.

Another aspect of the present invention provides a method for covalently attaching a polymer to a surface, for example a semiconductor surface as described previously. The method involves the steps of providing a hydrogen-terminated surface such as a porous or crystalline silicon surface. The surface is then reacted with a reagent having a reactive functional group where a resulting product involves a surface directly or indirectly bonded to the reactive functional group. A "reactive functional group" refers to any organic or inorganic group capable of reacting with another chemical reagent, and preferably the reactive functional group is capable of reacting with a polymer and either a monomer or oligomer unit of the polymer. The organometallic reagent can be any reagent described previously, and the reaction between the reagent and the surface can be performed by any method disclosed herein or by other methods well-known in the art. In one embodiment, the reagent provides a derivatized surface substantially free of oxidation. In one embodiment, the reagent is an organometallic reagent. In one embodiment, the organometallic reagent is an organolithium reagent. In another embodiment, the organometallic reagent is a Grignard reagent.

In one embodiment, the method comprises depositing a polymer on the surface to form the semiconductor surface/polymer junction. In a preferred embodiment, the depositing step is performed in a manner to allow the resulting polymer to be covalently attached to the surface via the reactive functional group. This can be achieved by depositing the polymer on the surface under polymerization conditions, or by depositing the polymer on the surface and subsequently exposing the deposited polymer to polymerization conditions.

In one embodiment, the depositing step occurs via electrochemical deposition, which allows the polymer to be deposited on the surface and provides covalent attachment between the deposited polymer and the surface. Covalent attachment can occur via a reaction between the reactive functional group and either a monomer unit to be polymerized, or the polymer itself. Electrochemical deposition can occur by the addition of an electrolytic solution of the monomer in an electrochemical apparatus. In one embodiment, the reactive functional group is capable of participating in a polymerization reaction with the monomer. Polymerization is facilitated if the reactive functional group has a structure resembling that of the monomer, i.e. a derivative. For example, the monomer in solution can be pyrrole, and the reactive functional group can be a pyrrole group or a derivative of a pyrrole group. Of course, any reactive functional group will suffice, whether or not its structure resembles the monomer, so long as polymerization can occur and interfacial communication between the semiconductor and polymer is optimal.

FIG. 1 shows a schematic representation of a derivatization of a silicon surface. A hydrogen-terminated silicon surface 2, such as porous silicon, is provided. The surface is exposed to an organometallic reagent having a reactive functional group. In FIG. 1, the organometallic reagent is an organolithium reagent having a reactive pyrrole functional group. After quenching the reaction with HCl, a pyrrole-terminated surface 4 having silicon-carbon bonds results, where surface 4 also contains unreacted Si-hydrogen bonds. The surface coverage (i.e., the percentage of sites having a silicon-carbon bond) is preferably at least about 25%, more preferably at least about 50% and more preferably still, at least about 60%. Electrochemical depostion of a 0.05 M pyrrole solution (in 0.1 M $LiClO_4/CH_3CN$) on surface 4 results in a semiconductor/polymer junction 6, where the polymer is covalently attached to semiconductor surface.

The presence of a covalent attachment can be determined by any method described previously (e.g., exposure to ultra high vacuum HF, or sonification). For the polymer-derivatized surfaces, an additional test for covalent attachment can be performed by monitoring adhesion properties. A test for adhesion can involve the application of scotch tape to the surface. A polymer-derivatized surface not having covalent attachment can be completely peeled off by a single application of scotch tape. In contrast, the covalently attached polymers of the present invention cannot be removed by the application of tape. Other tests for covalent attachment involve rinsing the surface with ethanol or drying the surface under a stream of nitrogen. Again, non-covalently attached polymers can be easily removed under these conditions whereas the polymer-derivatized surfaces of the present invention continue to adhere to the surface even under these conditions. The polymer film can only be removed as fragments by scratching with a metal stylus.

In one embodiment, the polymer-derivatized surfaces of the present invention show enhanced smoothness characteristics. Surface smoothness (or roughness) can be characterized as a standard deviation in the axial direction (z-axis) from a plane of the surface (the x-y plane). Theoretically, a perfectly smooth surface has a roughness value of zero. In one embodiment, the polymer-modified surfaces of the present invention have a roughness of less than about 200 nm, preferably less than about 100 nm, and more preferably less than about 50 nm.

The function and advantage of these and other embodiments of the present invention will be more fully understood from the examples below. The following examples are intended to illustrate the benefits of the present invention, but do not exemplify the full scope of the invention.

EXAMPLE 1

Single-polished p-Si(100) wafers (1–10 Ω–cm; 50 mm diameter) were obtained from Silicon Sense (Nashua, NH) and coated on their unpolished face with an evaporated film of Al (1000 Å) to produce an ohmic contact. Grignard reagents, acid chlorides, and other reagents were obtained from Aldrich, except for undecylenic bromide (Pfaltz & Bauer) which was used for the preparation of 10-undecylenicMgBr by standard methods.

Diffuse reflectance infrared spectroscopy were obtained at a resolution of 2 $cm^{-1}$ using a Bio-Rad FTS 175 spectrometer equipped with an MCT detector and a Universal Reflectance accessory (4 scans). X-ray photoelectron spectroscopy were obtained on a Surface Science X-100 spectrometer at a take-off angle of 55° using a monochromatized Al Ka x-ray source and a concentric hemispherical analyzer. Photoluminescence data were collected in a PTI fluorimeter using excitation wavelength of 355 nm selected from a xenon arc lamp.

In this example, the preparation of porous silicon is described. Porous silicon is prepared by anodically etching a p-type Si-(100) wafer (1–10 Ωcm) in 1:1 48% HF(aq)/EtOH in a Teflon cell. The etch conditions are typically 24 $mA/cm^2$ for 20 min. and used a Pt mesh counter electrode; these conditions produce a H-terminated layer of porous silicon on the silicon substrate. After etching, the samples are rinsed with EtOH, dried in a stream of $N_2$ and stored in a desiccator before use.

Figure 2A:
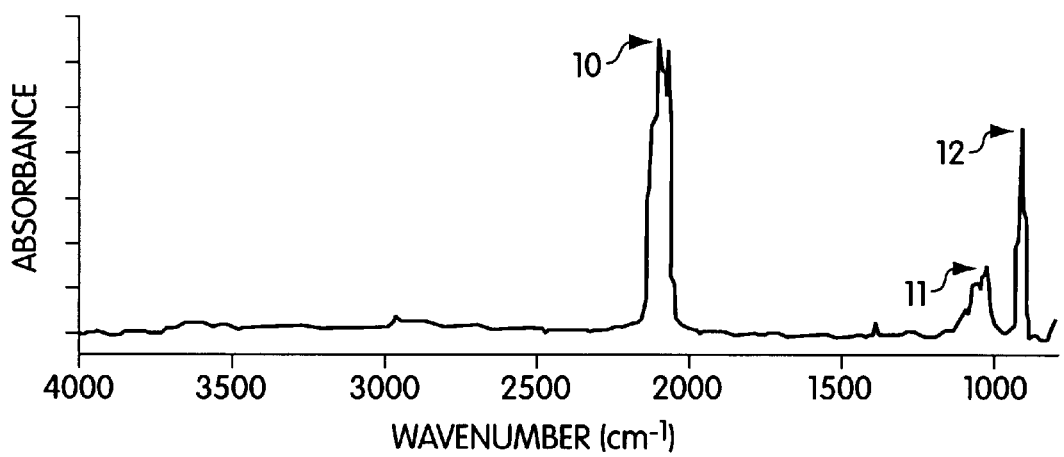
FIG. 2A shows a DRIFT spectrum for a porous silicon sample.

FIG. 2A shows a diffuse reflectance infrared Fourier transform (DRIFT) spectrum for a porous silicon sample that was formed by the electrochemical etching of Si(100) in HF acid/ethanol. The spectrum exhibits region 10 for Si—$H_x$ stretching modes at ~2116 $cm^{-1}$, region 11 for Si-O stretching modes at ~1031 $cm^{-1}$, and region 12 for Si—$H_2$ bending modes at ~914 $cm^{-1}$.

EXAMPLE 2

In this example, the general methodology for reacting porous silicon with various Grignard reagents is described.

The porous silicon samples are derivatized in a 0.5–1.0 M solution of the Grignard reagent in THF or ether for 1–2 h at room temperature under an atmosphere of $N_2$ and quenched by addition of anhydrous acid or acid halide. After reaction, the porous Si sample is rinsed with EtOH and dried thoroughly under a stream of $N_2$.

Example 3

Figure 2B:
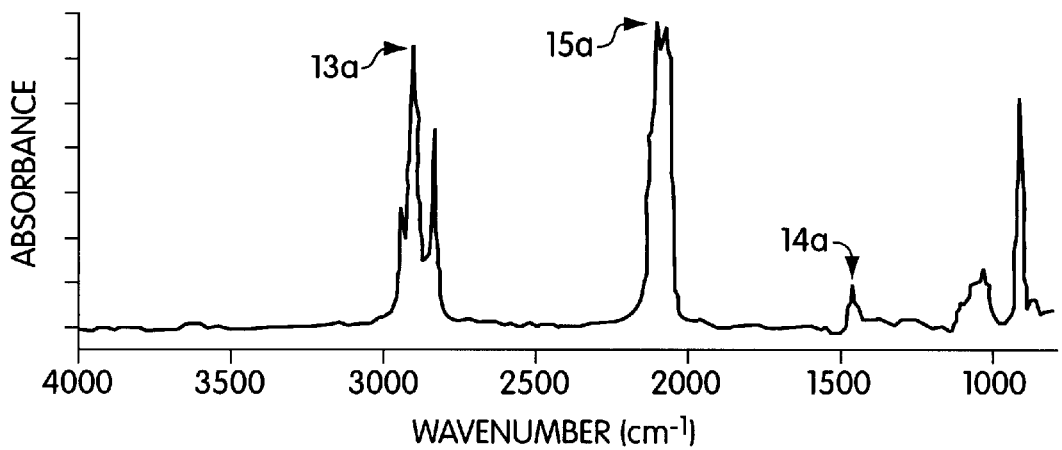
FIG. 2B shows a DRIFT spectrum of a porous silicon surface exposed to 1 M decylmagnesium bromide in ether with a subsequent quench Hcl.
Figure 2C:
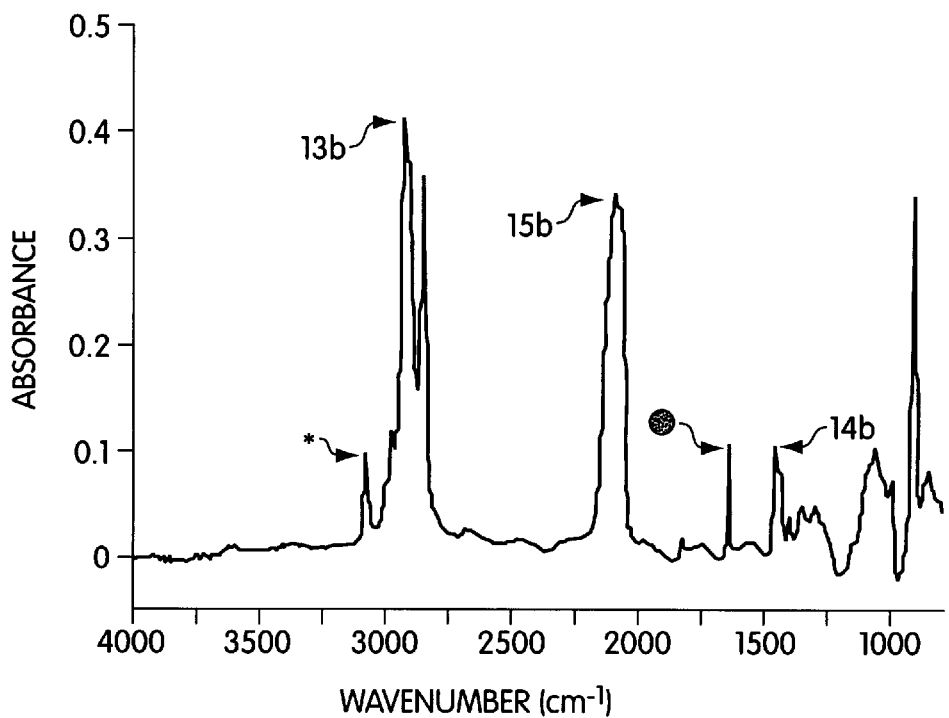
FIG. 2C shows a DRIFT spectrum for a porous silicon surface derivatized with undecylenic MgBr.
Figure 2D:
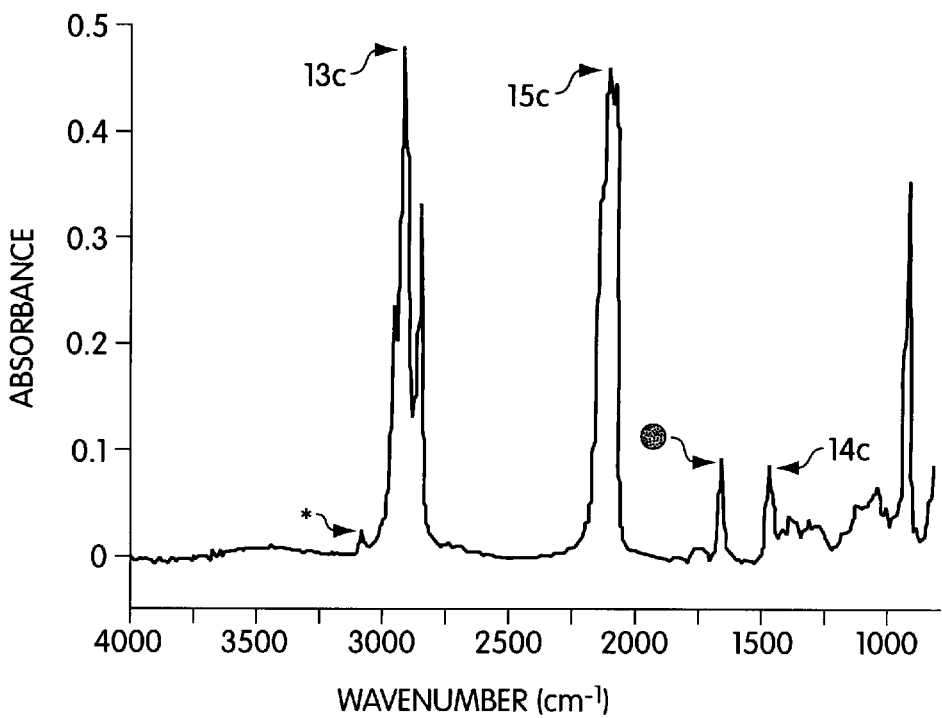
FIG. 2D shows a DRIFT spectrum for a porous silicon derivatized with decyl MgBr.

Porous silicon is exposed to 1 M decylmagnesium bromide in ether for 2 h at 25° C. and subsequent quench by addition of 1 M HCl in ether, its spectrum (FIG. 2B) contains alkyl stretching and bending absorptions (regions 13a and 14a, respectively) between 2850 and 2950 $cm^{-1}$ and 1300 and 1470 $cm^{-1}$, respectively, for the attached decyl chain. In the Si—$H_x$ stretching region (region 15a centered at ~2112 $cm^{-1}$), the absorption for Si—$H_3$ exhibits the biggest decrease compared to those for Si—H and Si—$H_2$ suggesting that the Si—$H_3$ moiety is the most reactive species and is lost during reaction. FIG. 2C shows a DRIFT spectrum for porous silicon derivatized with undecylenic MgBr at room temperature for 1 h and quenched with HCl in ether. FIG. 2D shows a DRIFT spectrum for porous silicon derivatized with decyl MgBr at room temperature for 1 h and quenched with 1 M undecenoyl chloride in THF. A comparison of FIG. 2C and FIG. 2D with FIG. 2B shows similar regions. (FIG. 2C: 13b ($CH_x$, 2932 $cm^{-1}$), 14b ($CH_2$, 1463 $cm^{-1}$), 15b (Si—$H_x$, 2095 $cm^{-1}$); FIG. 2D: 13c ($CH_x$, 2926 $cm^{-1}$), 14c ($CH_2$, 1463 $cm^{-1}$), 15b (Si—$H_x$, 2109 $cm^{-1}$)). FIGS. 2C and 2D show additional peaks for vinyl-H (*) (3081 and 3080 $cm^{-1}$, respectively) and C=C (●) (1642 and 1643 $cm^{-1}$, respectively). In addition, the signal at 1643 $cm^{-1}$ in FIG. 2D overlapps with a Si(C=O) mode.

To ensure that the hydrocarbon adsorption bands in FIG. 2B were not the result of adventitious contamination, additional derivatization reactions were performed using labeled Grignard reagents.

Figure 3A:
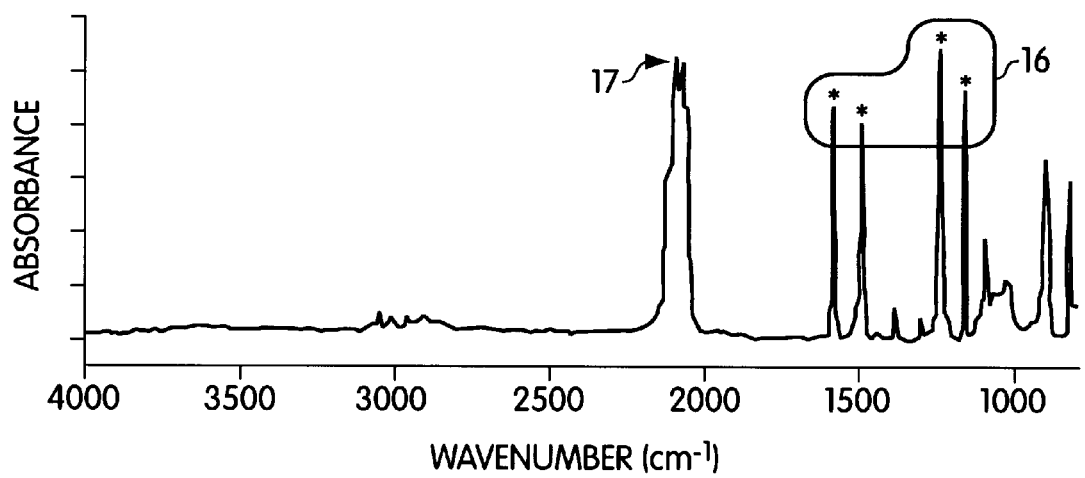
FIG. 3A shows an IR spectrum for porous silicon exposed to 0.5 M 4-fluorophenyl-magnesium bromide.

FIG. 3A shows the IR spectrum for porous silicon that was exposed to 0.5 M 4-fluorophenyl-magnesium bromide in THF for 2 h at 25° C. and subsequently quenched by addition of 1 M HCl in ether. The spectrum contains phenyl peaks in region 16 at 1591, 1498, 1245, and 1165 $cm^{-1}$ that correspond to a 4-fluorophenyl species and an Si—$H_x$ region 17 centered at ~2108 $cm^{-1}$.

Figure 4:
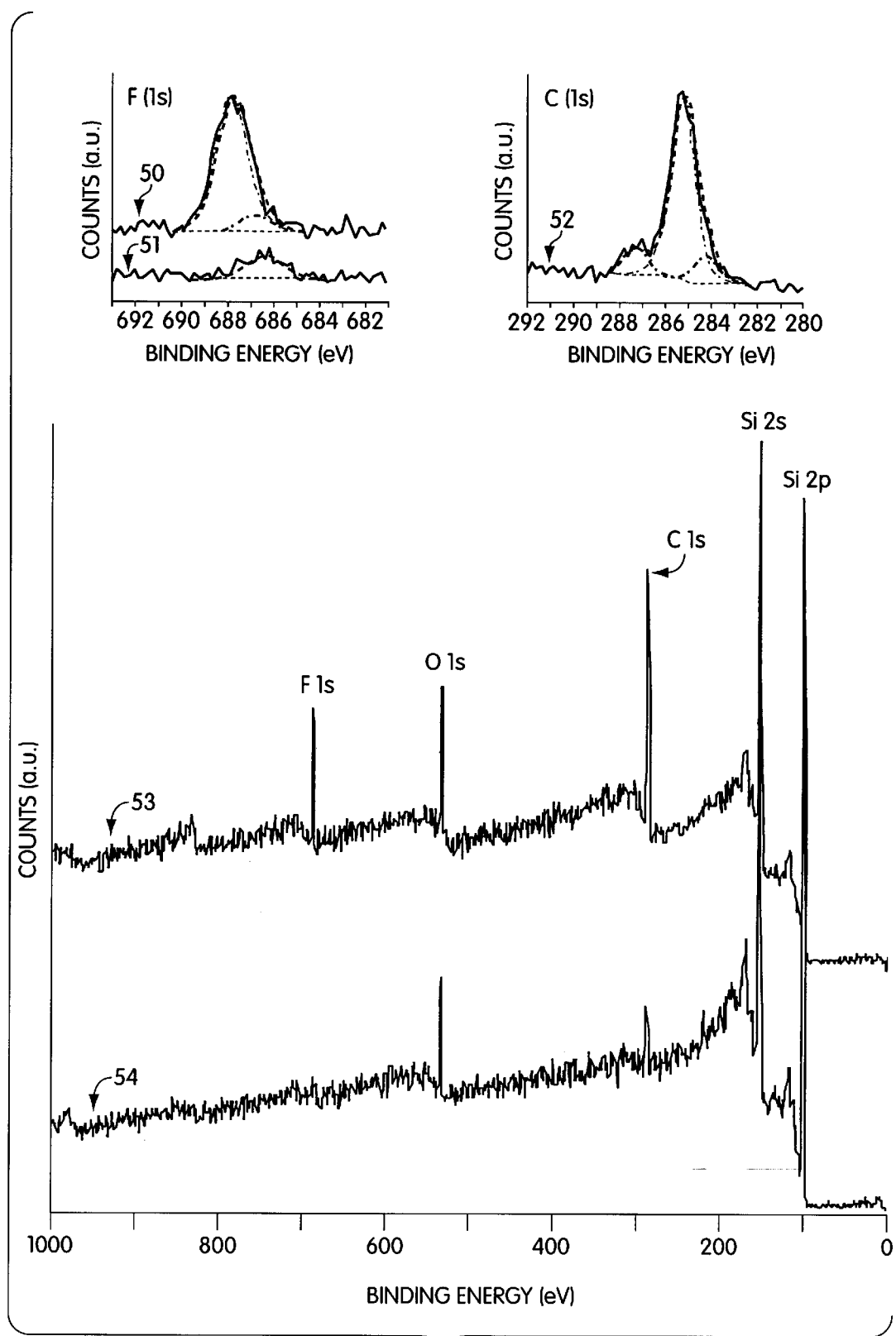
FIG. 4 shows an XPS spectrum for the derivatized surface of FIG. 3A.

The XPS spectrum for the derivatized surface displayed peaks due to two types of fluorine and three types of carbon and no detectable magnesium and bromide signals (FIG. 4). Dotted lines are based on deconvolution of the spectra (solid line) into their component peaks. In FIG. 4 (insets), the peaks at 686.9 and 688.0 eV (spectra 50 and 51) are assigned to fluorine atoms bonded to silicon and carbon, respectively, and the peaks at 284.3, 285.3, and 287.4 eV (spectrum 52) are assigned to carbon atoms where the peaks at highest and lowest binding energies are carbon atoms bonded to fluorine and silicon, respectively. The intensities of the carbon and fluorine peaks in the XPS spectrum were roughly those expected based on stoichiometry (F/C=1:7 vs 1:6; $C_F/C_{Si}/C_{total}$=1:1:9 vs 1:1:6). The spectral characteristics of the Si(2p) region of spectra 53 and 54 revealed little (or no) formation of silicon oxides during the reaction of porous silicon with the Grignard reagents (i.e. substantially free of oxidation).

Figure 3B:
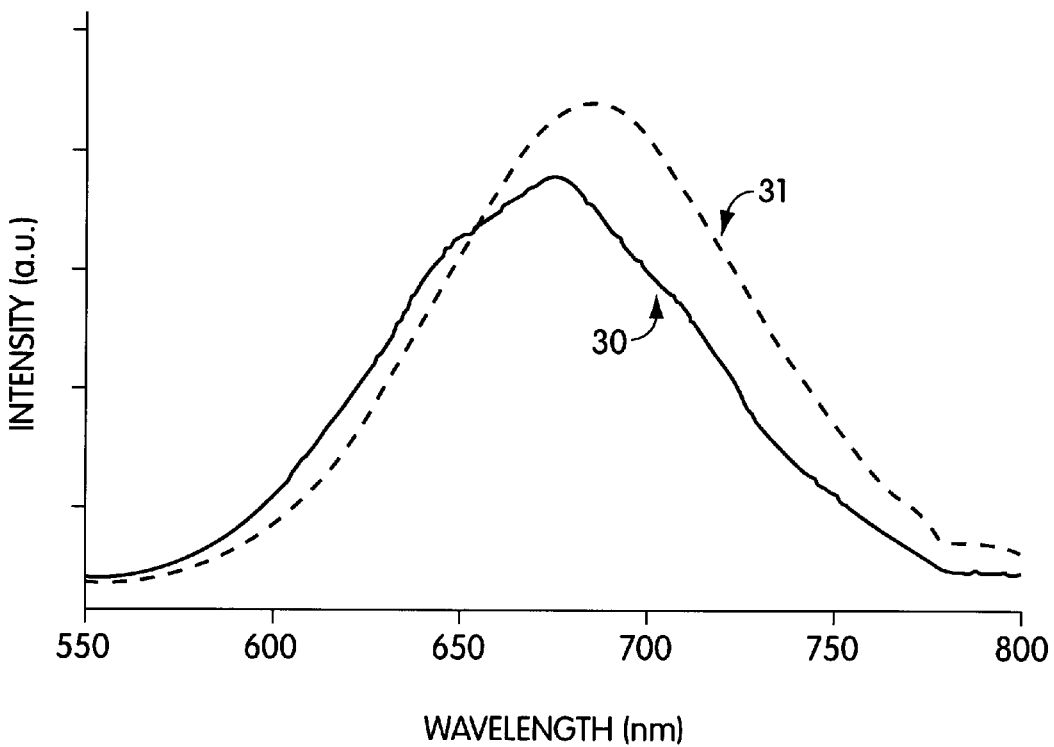
FIG. 3B shows a photoluminescence spectra before and after exposure to 0.5 M 4-fluorophenyl-magnesium bromide.

FIG. 3B shows photoluminescence spectra before (dashed line 30) and after exposure to 0.5 M 4-fluorophenyl-magnesium bromide in THF for 2 h at 25° C. and subsequently quenched by addition of 1 M HCl in ether (solid line 31). The incident light source for acquisition of the photoluminescence spectra was 355 nm.

Derivatized samples exposed to ultrahigh vacuum, HF acid/ethanol, and/or sonication in toluene (2×5 min) exhibited no change in the IR and XPS characteristics for the adsorbed species from those before these treatments. This stability suggests the formation of robust, covalently attached species to the silicon surface. The resistance of the layers to 48% HF acid(aq)/EtOH (1:1) provided further indication that the Grignard reagents form Si—C (and not Si—OR) linkages at the surface. The reactions proceeded to a saturation coverage and exhibited no further change upon extended exposure to the Grignard solution. The derivatization of porous silicon by the Grignard reagent was complete within 2 h for 0.5–1.0 M solution in THF or ether at room temperature. In the cases of extended exposure (such as 1 or 2 days), the porous silicon sample exhibited the same degree of derivatization based on DRIFT. The Grignard derivatization of porous silicon has the advantage over the use of alcohols to derivatize porous silicon as the latter method requires elevated temperatures (45–90° C.), and it degrades the surface during extended exposure to the reagents.

EXAMPLE 4

Figure 5:
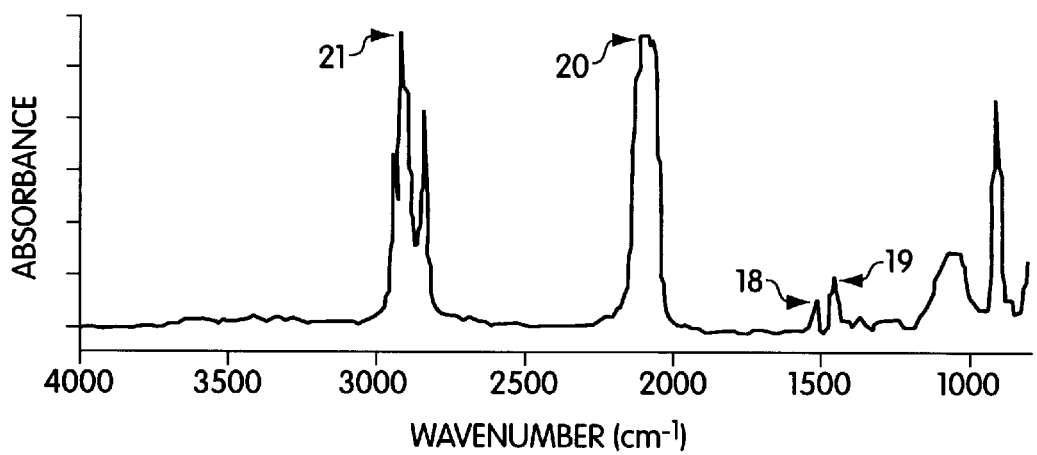
FIG. 5 displays an IR spectrum for porous silicon treated with decylmagnesium bromide and quenched with $CH_3CO_2D$.

FIG. 5 displays the IR spectrum for porous Si treated with decylmagnesium bromide (1 M in THF) for 2 h at room temperature and quenched with $CH_3CO_2D$ (5 min at room temperature). The spectrum is similar to that in FIG. 2B with the notable addition of a peak at 1515 $cm^{-1}$ due to the formation of Si—D (Si—D region 18; region 19 corresponds to $CH_2$ bending; region 20 corresponds to Si—$H_x$; region 21 corresponds to $CH_2$ stretching). The generation of Si—D species can be rationalized as a result of silyl anions formed from the breakage of Si—Si bonds by the attacking Grignard reagent; for comparison, Si—D species were not produced in control experiments where porous Si was treated only with $CH_3CO_2D$ for similar periods of time. (FIGS. 3 and 5 allow a comparison of the level of Si—D formation for two samples that were exposed to $CH_3CO_2D$ for the same period of time (5 min at room temperature), Si—D formation only occurred under these conditions when exposure to $CH_3CO_2D$ was immediately preceded by exposure to a Grignard reagent.) That Si—D species did not form by exposure to just $CH_3CO_2D$ but required reaction with Grignard reagents previous to this exposure suggests that the formation of the covalently attached organic layer does not proceed by a reaction that substitutes Si—H bonds with Si—C bonds (as for a hydrosilation process) but instead proceeds by opening new sites on the Si surface (see equation 1) that are then available for substitution. This mechanism would proceed with attachment of organic species to the surface and relatively little change in the amount of Si—H termination, as seen by IR (FIG. 2A). This reaction is proposed by analogy to the breakage of Si—Si bonds that occurs during the etching of silicon by weak nucleophiles such as alcohols at elevated temperatures.

EXAMPLE 5

The formation of surfacial silyl anions by the Grignard reagent was further suggested by the observation that porous silicon sequentially treated with decylmagnesium bromide. THF as wash at −78° C. (2×2 mL), acetyl chloride (neat or 1 M in THF), and $CH_3CO_2D$ shows peaks at 1648 (region 22) and 1750 $cm^{-1}$ and no Si—D peak at 1515 $cm^{-1}$ (FIG.

Figure 6:
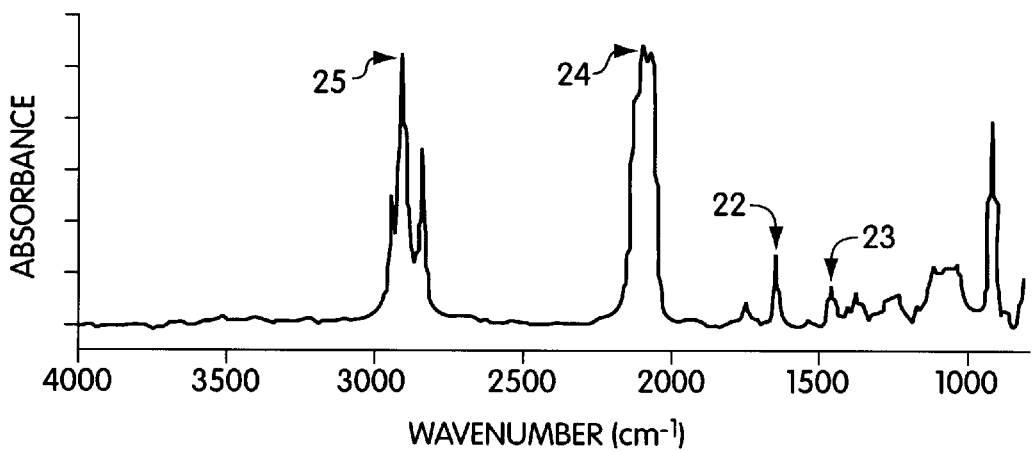
FIG. 6 shows an IR spectrum of porous silicon treated with decylmagnesium bromide, acetyl chloride and $CH_3CO_2D$.

6—region 23 corresponds to $CH_2$ bending; region 24 corresponds to Si—$H_x$; region 25 corresponds to $CH_2$ stretching). The 1648 cm$^{-1}$ peak can be assigned to the formation of surfacial acylsilyl species that were produced by reaction between the acyl chloride and the generated surfacial silyl anions; no peaks in the carbonyl region were observed when porous silicon was treated with acetyl chloride under these reactions conditions without an immediately preceding exposure to a Grignard reagent. When porous silicon was reacted with decylmagnesium bromide and quenched with undecenoyl chloride, the DRIFT spectrum exhibited a peak at 1643 cm$^{-1}$ due to the acylsilane C=O and vinyl C=C stretching modes and at 3080 cm$^{-1}$ for the vinyl C—H stretching mode that are not present in FIG. 2B. The assignment of the 1643 cm$^{-1}$ mode to the acylsilane C=O stretching was based on its enhanced integrated intensity in this sample when compared to a porous silicon sample derivatized by undecylenic magnesium bromide and quenched with acid. (The area ratio between the peak at 1643 cm$^{-1}$ and the peaks at 3080 cm$^{-1}$ was ~6:1 for porous silicon reacted sequentially with decyl magnesium bromide and undecenoyl chloride and only ~0.6:1 for porous silicon derivatized by undecylenic magnesium bromide and quenched by acid. This difference can be ascribed to the formation of an acylsilane species for the former case.) The reaction of Grignard-treated porous silicon with acid chlorides produced samples that consistently exhibited a peak at ~1645 cm$^{-1}$ in their IR spectra regardless of the Grignard reagent used. (In FIG. 6, the peak at ~1750 appeared for many samples that were sequentially functionalized with Grignard reagents and acid chlorides; however, the identity of this peak has not yet been established. For comparison, the absorptions for acetyl chloride, acetic acid, and sodium acetate appear at 1810, 1718 and ~1590 cm$^{-1}$, respectively.) The generation of the surfacial silyl anions is an interesting result of the Grignard reaction, and these reactive intermediates may provide sites for attaching other types of electrophiles onto the silicon surface.

EXAMPLE 6

In this example, the reaction of various organolithium reagents with porous silicon is described.

For derivatization of Si by an organolithium reagent, the sample is placed in a 20 mL glass vial, and a solution of an organolithium reagent (methyl-, butyl-, hexyl-, phenyl-, or 5-(N-pyrrolyl)-pentylLi) is added under an atmosphere of $N_2$. After 0.5–4 h at room temperature, the reaction is quenched by addition of an anhydrous acid (1 M HCl in ether or $CH_3CO_2D$). Derivatized Si samples are rinsed with EtOH and dried thoroughly under a stream of $N_2$ prior to analysis by diffuse reflectance or attenuated total reflection infrared spectroscopy (for porous and crystalline silicon substrates, respectively) and x-ray photoelectron spectroscopy. Spectral changes were observed for reactions of porous and crystalline silicon substrates with organolithium reagents such as butyl, hexyl, and phenylLi. IR spectra for crystalline silicon were obtained by attenuated total reflection.

Figure 7:
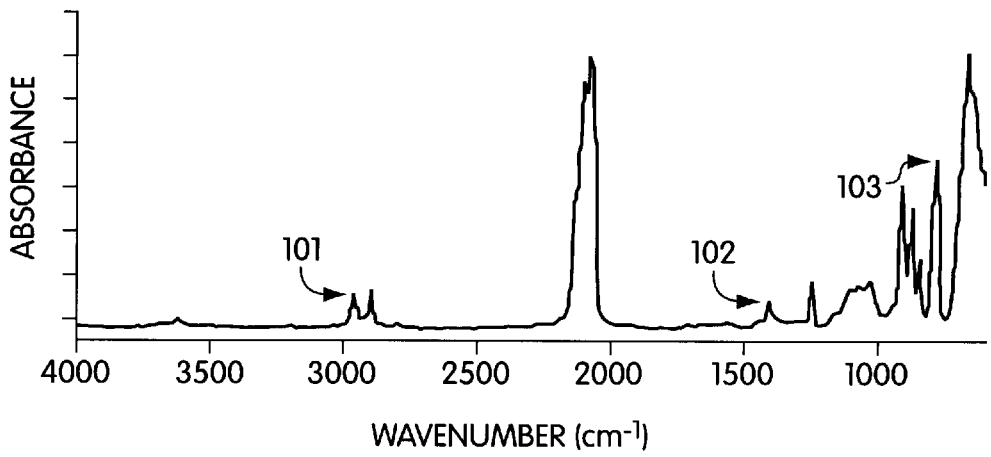
FIG. 7 shows a DRIFT spectrum of porous silicon exposed to $CH_3Li$.

After exposure to 1.6 M $CH_3Li$ in THF at room temperature for 2 h and a subsequent quench by addition of 1 M HCl in ether, the IR spectrum (FIG. 7) exhibits peaks for methyl stretching at 2963 and 2897 cm$^{-1}$ (region 101), methyl bending at 1406 and 1248 cm$^{-1}$ (region 102), and Si—C stretching at 779 cm$^{-1}$ (region 103). The presence of the Si—C absorption reveals that $CH_3Li$ forms a covalent bond to the silicon surface. When porous silicon is sequentially treated with $CH_3Li$ and quenched with $CH_3CO_2D$, its spectrum displays a peak at 1513 cm$^{-1}$ for Si—D stretching in addition to the peaks in FIG. 7; in contrast, no Si—D peak was observed when porous silicon was exposed only to $CH_3CO_2D$. As the general spectral changes mirror those for the reactions of porous silicon with Grignard reagents, the reaction with RLi to form Si—C attachments is likely to proceed similarly by breakage of surfacial Si—Si bonds.

Figure 8:
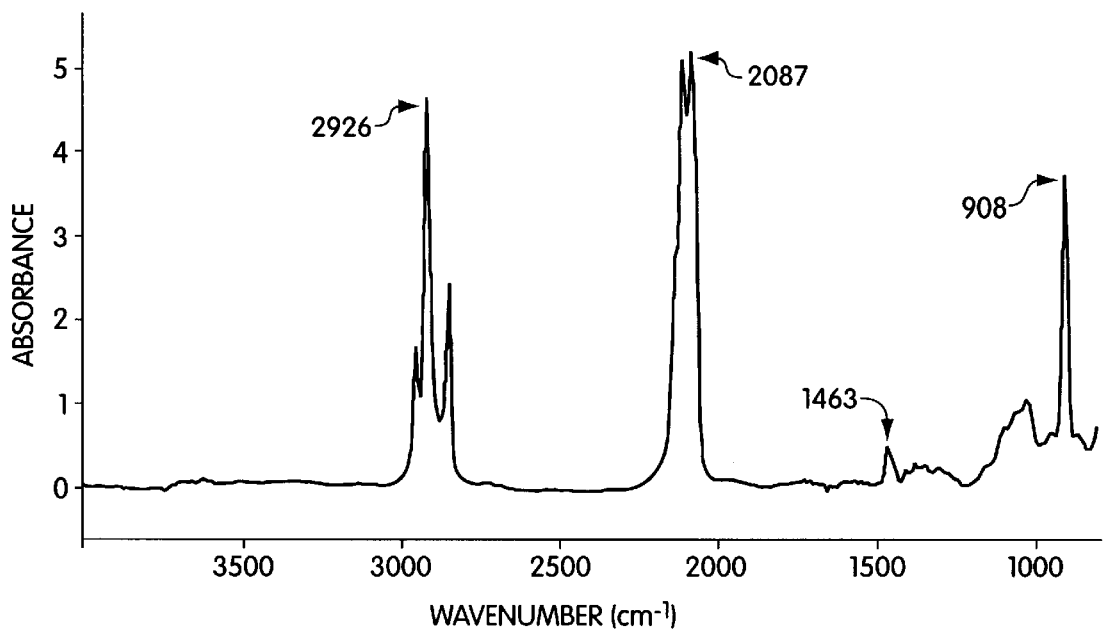
FIG. 8 shows a DRIFT spectrum for porous silicon derivatized with hexylMgBr.
Figure 9:
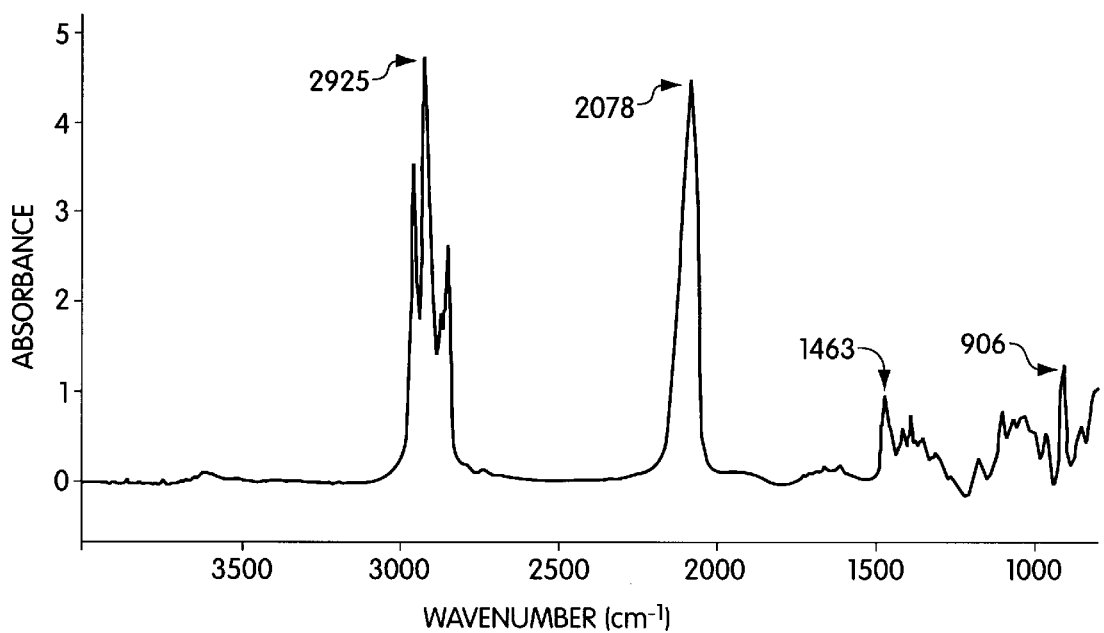
FIG. 9 shows a DRIFT spectrum for porous silicon derivatized with hexylLi.

FIGS. 8 and 9 show diffuse reflectance infrared spectra for porous silicon derivatized at room temperature for 2 h with hexylMgBr (FIG. 8) and hexylLi (FIG. 9), where both reactions are quenched with HCl in ether.

Derivatized samples exhibited no change in their IR spectra after exposure to ultra high vacuum, HF(aqueous) in ethanol, or sonication in toluene, further suggesting formation of a robust, covalent attachment to the silicon surface.

The derivatization of these hydrogen-terminated silicon surfaces by organolithium reagents yielded a higher coverage of attached species than reactions using Grignard reagents. The higher coverages were suggested by IR spectroscopy, where the C—$H_X$ stretching intensity was greater for a sample modified by an organolithium reagent than by a corresponding Grignard reagent and likely reflected the more reactive nature of an organolithium reagent. The greater reactivity of an organolithium reagent was also evident by a more significant decrease in the Si—$H_x$ stretching intensity than after reaction with a Grignard reagent. This difference suggests that the organolithium reaction occurs with a greater degree of Si—Si bond cleavage than with Grignard reagents.

EXAMPLE 7

Figure 10:
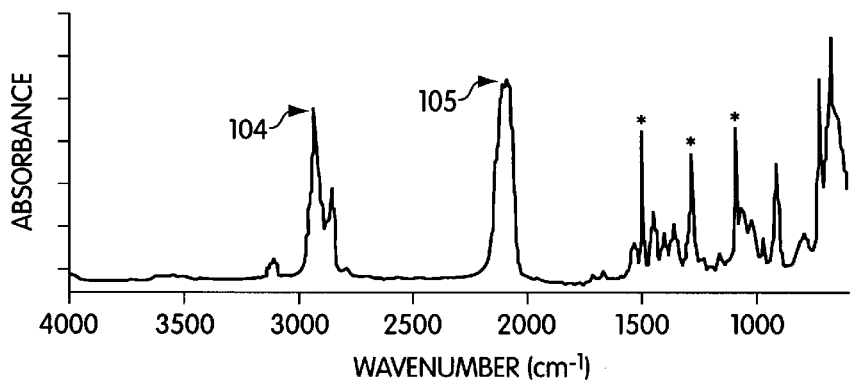
FIG. 10 shows an IR spectrum for porous silicon exposed to 0.2 M 5-(N-pyrrolyl)-pentylLi.
Figure 11:
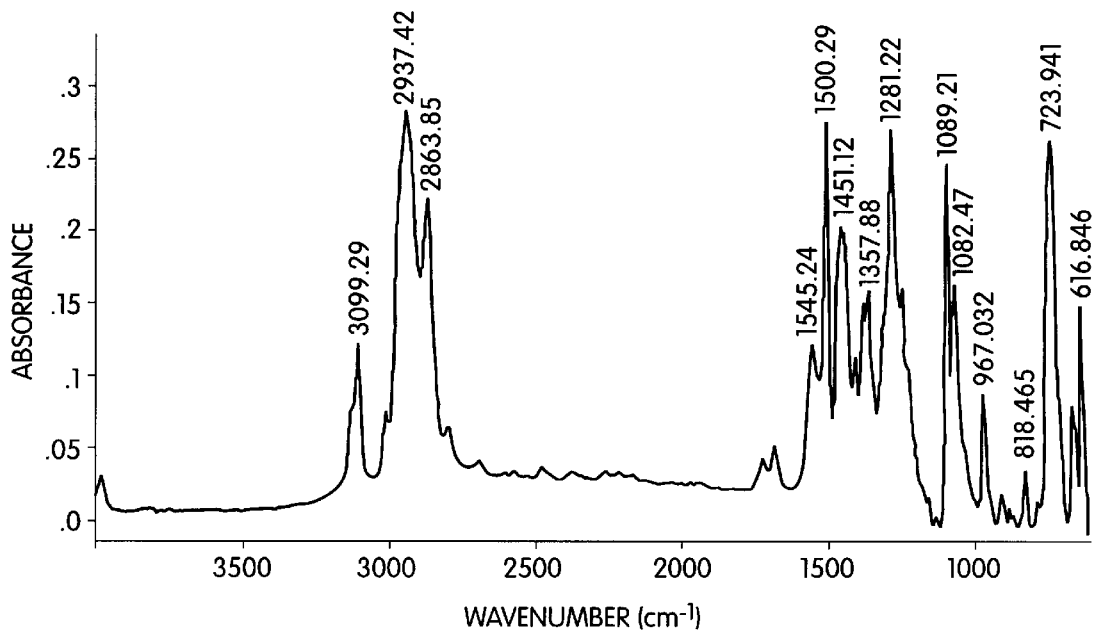
FIG. 11 shows an IR spectrum for neat 1-bromo-5-(N-pyrrolyl)-pentane.

Various H-terminated silicon samples were derivatized with 5-(N-pyrrolyl)pentylLi. FIG. 10 shows the IR spectrum for porous silicon after treatment with 0.2 M 5-(N-pyrrolyl) pentylLi in THF, as produced by reaction between 1-bromo-5-(N-pyrrolyl)-pentane (Willicut, R. J. et al., Langmuir, Vol. 11, 296–301, 1995) and the lithium-naphthalene radical (Freeman, P. K. et al., J. Org. Chem., Vol. 45, 1924–1930, 1980). The peaks between 1100 and 3100 cm$^{-1}$ (region 104 corresponds to CH2 stretching modes,~2932 cm$^{-1}$; region 105 corresponds to Si—Hx,18 2109 cm$^{-1}$) agree well with those for a 5-(N-pyrrolyl)pentyl species by comparison to the IR spectrum for neat 1-bromo-5-(N-pyrrolyl)-pentane (FIG. 11). The modification of p-type Si(100) was supported similarly by IR and also by XPS where the samples displayed a new peak for nitrogen and increased peak intensity for carbon after derivatization.

Figure 12:
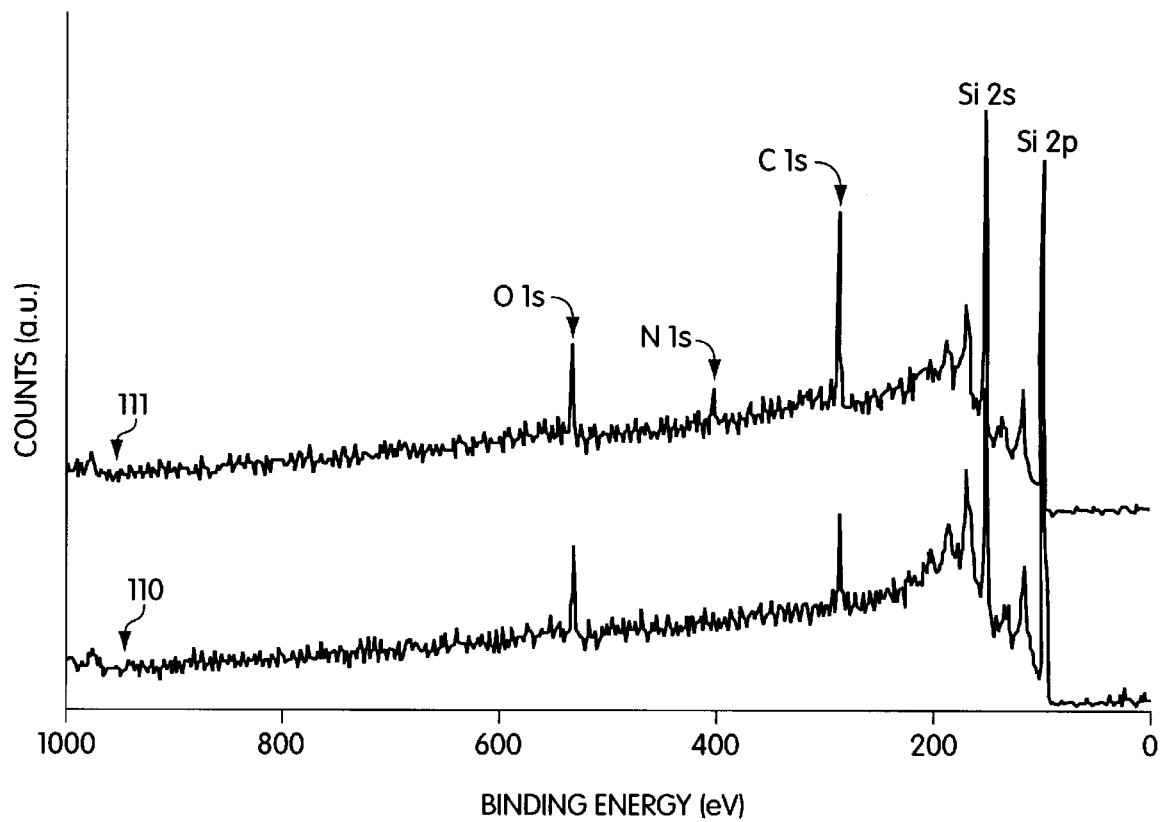
FIG. 12 shows an XPS spectrum for H—Si(100) shown before and after derivatization with 5-(N-pyrrolyl)-pentylLi.
Figure 13:
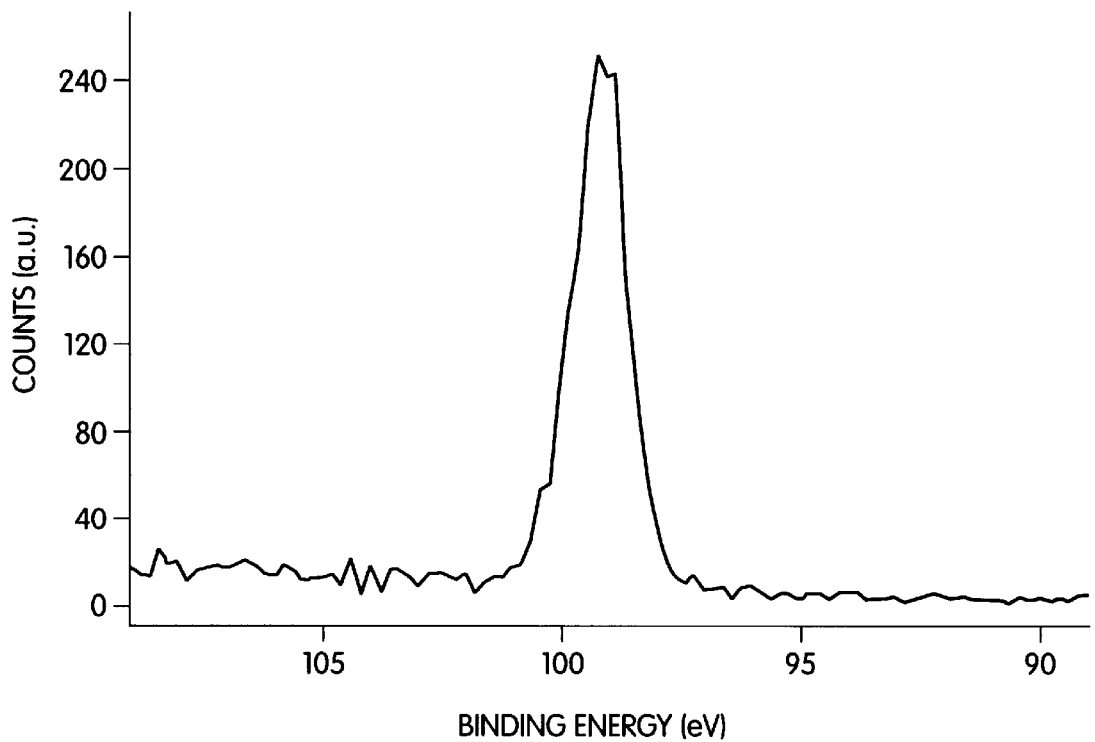
FIG. 13 shows a survey spectrum and the Si(2p) region before derivatization.
Figure 14:
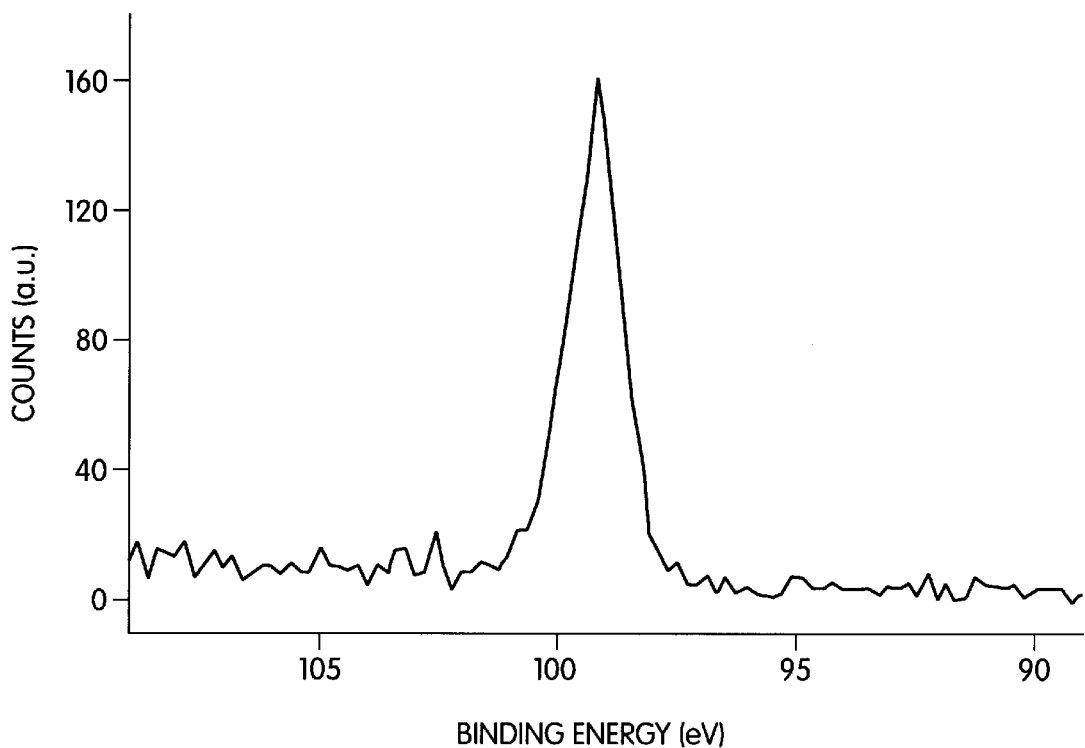
FIG. 14 shows a survey spectrum and the Si(2p) region after derivatization with 5-(N-pyrrolyl)-pentylLi.
Figure 15:
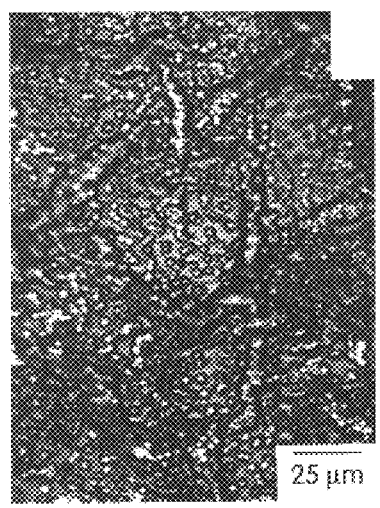
FIG. 15 shows a photocopy of an optical image for an H-terminated silicon surface.

X-ray photoelectron spectra for H—Si(100) is shown before (FIG. 12, spectrum 110) and after (FIG. 12, spectrum 111) derivatization with 5-(N-pyrrolyl)-pentylLi at room temperature for 2 h and quenched with HCl in ether. Survey spectra and the Si(2p) region are shown before (FIG. 13) and after (FIG. 14) derivatization. As the spectral region for Si(2p) showed no change in position or shape and the O(1s) signal exhibited only a slight increase after reaction, the organolithium reaction appears to proceed with no (or little) oxidation of the surface. By XPS, a surface coverage of ~60% can be estimated for the pyrrole film by comparing its N(1s) intensity to that for a SAM of $HS(CH_2)_{10}CONH_2$ on gold.

EXAMPLE 8

Figure 16:
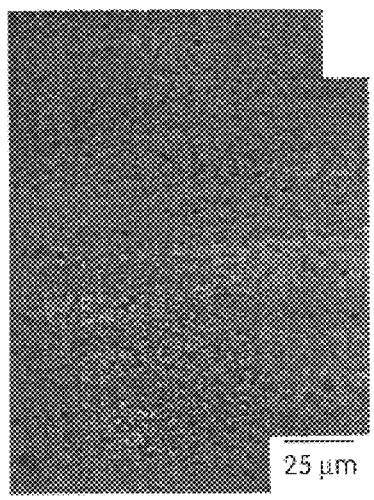
FIG. 16 shows a photocopy of an optical image for an H-terminated silicon surface derivatized with a polypyrrole film.
Figure 17:
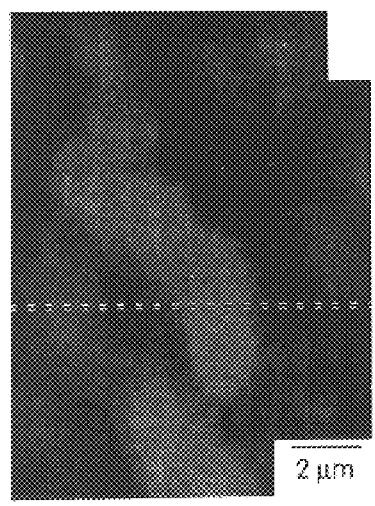
FIG. 17 shows a photocopy of an AFM image for an H-terminated silicon surface.
Figure 18:
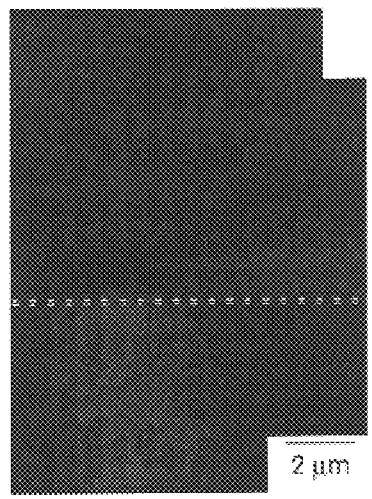
FIG. 18 shows a photocopy of an AFM image for an H-terminated silicon surface derivatized with a polypyrrole film.
Figure 19:
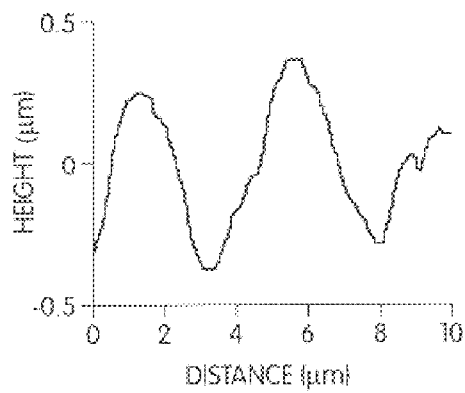
FIG. 19 shows a cross-sectional view for the dashed line in FIG. 17.
Figure 20:
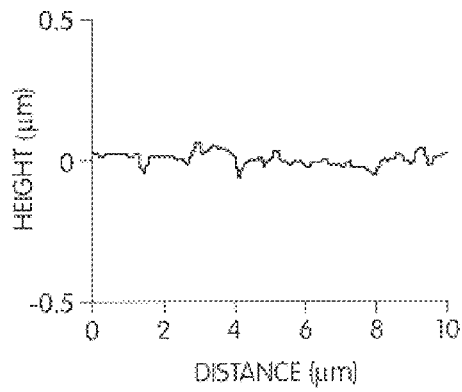
FIG. 20 shows a cross-sectional view for the dashed line in FIG. 18.

Using both native and modified hydrogen-terminated Si(100) as electrodes, polypyrrole films were electrochemically deposited on their surfaces. The electrochemical polymerization is performed using Pt mesh as a counter electrode and a solution of 0.1 M LiClO$_4$ and 0.05 M pyrrole in CH$_3$CN at a current density of 0.5 mA/cm$^2$ (~600 mV vs. Ag/AgNO$_3$) for 400s. The surface area of the electrode is 0.2 cm$^2$, and the resulting polymers are ~2.5 µm thick based on coulometry. For galvanostatically controlled polymerizations, the deposition potentials exhibited less temporal variation for the modified silicon, suggesting a more uniform growth of the polymer. The polypyrrole film on H-terminated silicon was black and had a visibly rough texture, while the polymer on the modified silicon was dark blue and had a mirror-like finish by eye. FIGS. 15–20 show optical and AFM images for the polymers on these silicon surfaces. The differences in surface morphology are readily apparent, where the unmodified substrate (FIG. 15) shows a rougher surface than the modified one (FIG. 16). FIGS. 17 and 18 show AFM images on native and modified hydrogen-terminated silicon, respectively. FIGS. 19 and 20 show the cross-sectional views for the dashed line in FIGS. 17 and 18, respectively. By AFM, the polymer on the modified surface was ~10 times smoother than on the native hydrogen-terminated surface (roughnesses of 25 and 219 nm, respectively). The surface modification with 5-(N-pyrrolyl)pentylLi also improved the adhesion of polypyrrole to silicon. For example, on the native H-terminated silicon, the polymer often peeled from the surface upon rinsing with ethanol or drying under a stream of N$_2$, and could be completely removed in a single application of scotch tape. In contrast, polypyrrole on the modified silicon was not removed by these conditions or the repeated application of tape. The polymer film could only be removed from silicon as fragments by scratching with a metal stylus.

The above morphological and adhesional differences in the polymer films can be attributed to changes in the nucleation and growth on the two substrates. The substrate modification provides organic sites on the silicon surface for polymer attachment that aid the electrodeposition process. This change to a more regular and uniform growth is supported by the greater constancy of the deposition potential during electrochemical polymerization onto the modified samples. The possibility that the difference was due simply to the alkyl chains of the 5-(N-pyrrolyl)pentyl film was excluded as being unlikely, as polypyrrole deposited onto silicon derivatized by CH$_3$(CH$_2$)$_3$Li exhibited similar characteristics on native H-terminated silicon. A similar result was reported for polypyrrole films on gold. Polypyrrole deposited on gold modified with an n-alkanethiol exhibited similar characteristics to that formed on bare gold. It is believed that the incorporated pyrrole units on the silicon surface are responsible for the quality of these conducting polymer thin films by providing a covalent link between the polymer and silicon. This procedure should be general for other silicon/conducting polymer junctions. The current-voltage characteristics of these junctions on substrates of various dopant densities were also investigated. By cyclic voltammetry, the junctions to both p- and n-type silicon exhibit rectification, with the junctions on the modified silicon exhibiting up to 100 times higher current densities in forward bias than those on the native H-terminated silicon. Presently, the presence of the pyrrole-containing film on the surface of silicon appears to improve the electrical properties of the polypyrrole/silicon junction by enhancing interfacial charge transfer between the two phases.

EXAMPLE 9

Prior to reacting silicon with the organolithium reagent, ohmic contacts are made to the back sides of the substrates using a In-Ga eutectic for n-Si (3–5 and 0.005–0.02 Ω.cm) and evaporated Al for p-Si (1–10 Ω.cm). Thin polypyrrole films on the front faces of both the native and modified H-terminated Si(100) samples by an electrochemical (photo)anodization process at 600 mV vs. Ag/AgNO$_3$ in a 0.1 M LiCO$_4$/ 0.05 M pyrrole solution in CH$_3$CN. The thicknesses of the resulting polypyrrole layers were ~0.5 and 1 µm on the n- and p-type samples, respectively. Electrical contacts to polypyrrole were made with evaporated gold.

Figure 21:
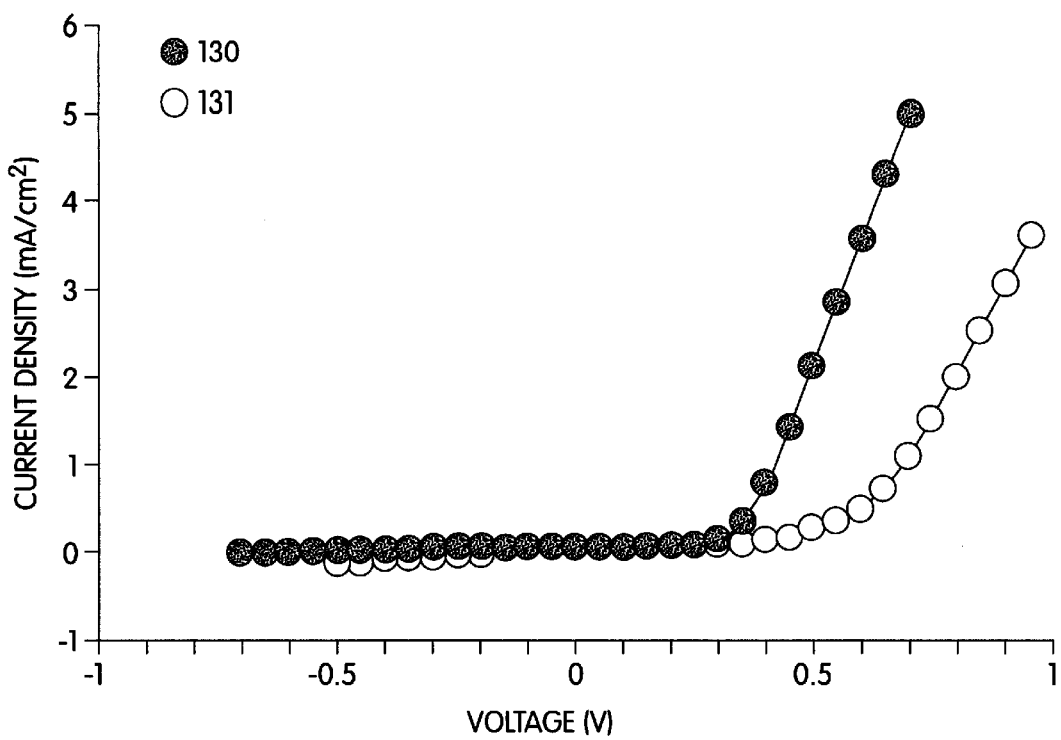
FIG. 21 shows a voltage (x-axis) vs. current density plot for polypyrrole/n-Si junction formed on a unmodified and modified surface.

The effects of the surface modification were examined on the j vs. V and C vs. V characteristics of the polypyrrole/silicon junctions. FIG. 21 shows the current-voltage characteristics of polypyrrole/n-Si (3–5 Ω.cm) junctions formed on a native and modified H-terminated surface. Both the modified and unmodified junctions exhibited diode-like behavior as indicated by curves 130 and 131 respectively; however, the surface modified with the organic monolayer exhibited higher forward currents. In reverse bias, small currents are observed for both samples, with the current being smaller for the derivatized sample. Taken together, the derivatized samples exhibited superior diode-like characteristics. Similar experiments on less resistive n-Si and on p-Si and observed less rectification and higher reverse currents than for the sample in FIG. 21. The reverse currents exhibited a more ohmic behavior for the less resistive n-Si samples and were approximately 1 mA/cm$^2$ for the p-type samples. In comparing junctions made from both the less resistive n-Si and from p-Si, the modified surfaces consistently exhibited higher forward currents.

Figure 22:
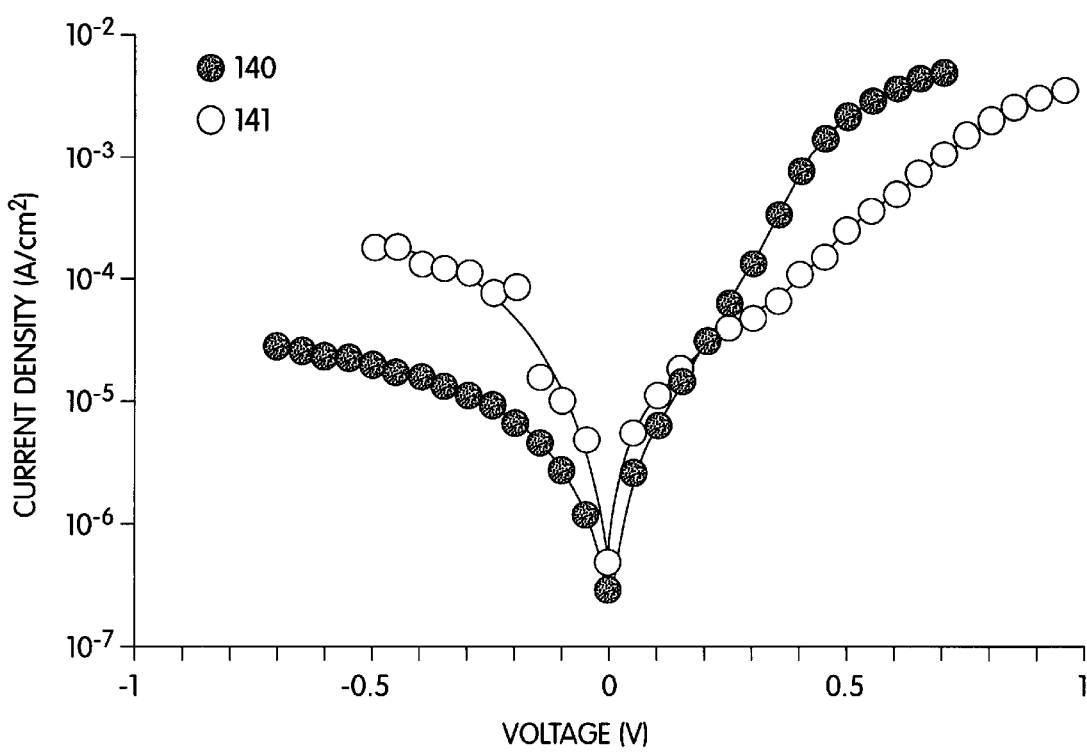
FIG. 22 shows a voltage (x-axis) vs. current density plot for polypyrrole/n-Si junction formed on a unmodified and modified surface.

According to thermionic emission theory for semiconductor/metal diodes, their currentvoltage characteristics are largely determined by the potential barrier height, $\phi_b$, at the interface. Specifically, the value of the barrier height can be determined from a semilog plot of j vs. V in the forward region. By making the assumption that the polypyrrole can be treated like a metal (as suggested by others for related semiconductor/polymer interfaces and particularly for junctions using low-doped silicon), barrier heights can be obtained with similar values of 0.76 and 0.72 eV for the derivatized and underivatized n-Si samples, respectively (FIG. 22; derivatized 140, underivatized 141). From the data in FIG. 22, we obtained ideality factors, n, of 1.5 and 2.3 for the derivatized and underivatized samples, respectively. These values are higher than those obtained for many metal/semiconductor contacts but are comparable to or better than most reported values for conducting polymer/semiconductor contacts. The non-ideal behavior of the junctions has been attributed to the discontinuous nature of the organic/inorganic interface, both in terms of its structure and conduction mechanism. The presence of the pyrrole-containing interlayer offers an improvement in the ideality of the silicon/polypyrrole junction.

EXAMPLE 10

Figure 23:
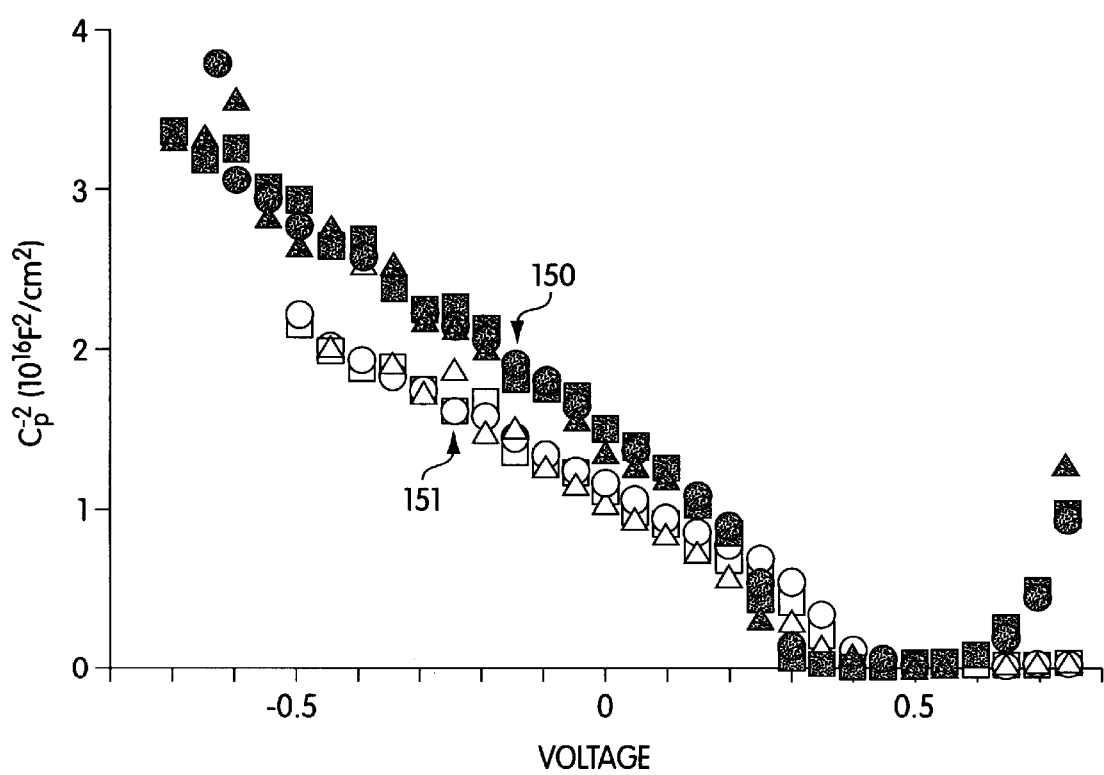
FIG. 23 shows results of CV measurements on both a derivatized and underivatized polypyrrole/n-Si surface.

FIG. 23 shows the results of CV measurements on both a derivatized (curve 150) and underivatized (curve 151) polypyrrole/n-Si (3–5 Ω.cm) sample as a Mott-Schottky plot ($C_p^{-2}$ vs. V). The Mott-Schottky plots exhibited no frequency dependence between 0.5 and 10 kHz, and were linear over a potential range of almost 1 V. Extrapolation of the linear regions to 0 V yielded the flatband potential and $\phi_b$. From the data in FIG. 23, a value of 0.78 eV can be obtained for both the derivatized and underivatized samples, in agreement with the values obtained by the current-voltage measurements. From the slope of the Mott-Schottky plots, a donor density of 5×10$^{14}$ cm$^{-3}$ for the silicon can be obtained and this value agrees with its estimated density based on conductivity measurements. For these junctions, one can conclude that the potential drops primarily over the semiconductor, justifying our analysis of this system as a metal/semiconductor contact. For less resistive n-Si samples, one can similarly conclude that the potential dropped primarily over the semiconductor. With the p-type samples (1–10 Ω.cm), a linear region is observed in the Mott-Schottky plots only for the derivatized sample and obtained a value between 0.15 and 0.20 eV for its barrier height. This small value for $\phi_b$ is consistent with the high reverse currents for the polypyrrole/p-Si junctions.

EXAMPLE 11

Figure 24:
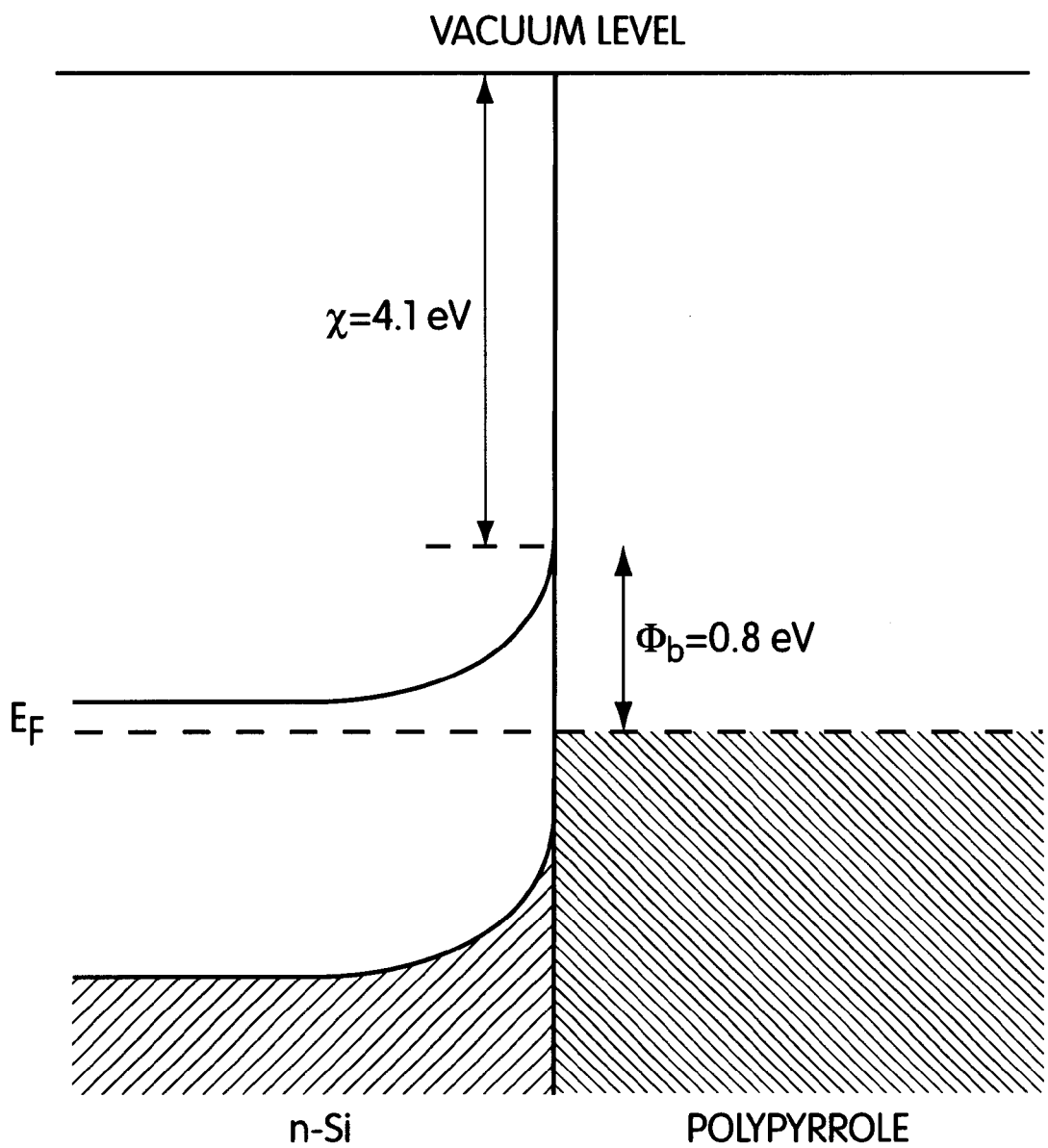
FIG. 24 shows a band energy diagram for n-Si in contact with polypyrrole.

The present results allow construction of a band energy diagram for n-Si (3–5 Ω.cm) in contact with polypyrrole (FIG. 24). Based on the determined value of 0.8 eV for $\phi_b$ and the electron affinity of silicon $\chi$ of 4.1 eV obtained from the literature, the Fermi level on the polypyrrole side is estimated to be 4.9 eV. This value agrees well with reported values, and the large barrier height for this junction (~0.8 eV) is compatible with its observed diode-like behavior and its small reverse current. Approximately the same value is estimated from the results on the p-type junctions (~0.5 eV), based on the electron affinity and band gap energy of silicon and the determined value of 0.15–0.20 eV for the barrier height. The similarity in the determined value of the Fermi level for polypyrrole indicates that the band edge position is the same for n- and p-type samples in contact with polypyrrole. Since the Fermi level in the organic layer is closely positioned to the valence band edge (the barrier height is only 0.15–0.20 eV), the p-silicon/polypyrrole junction would be expected to be a less rectifying contact as was observed experimentally. The increased donor density for 0.005–0.02 Ω.cm n-Si as compared to 3–5 Ω.cm n-Si depicted in FIG. 24 probably results in a thinner space charge layer for the former sample and leads to an increased probability for elecron tunneling. As a result, the junction on the former substrate is less rectifying.

These results show that the surface modification of hydrogen-terminated Si with a covalently attached pyrrole-terminated molecular film improves the electrical characteristics of silicon/polypyrrole junctions prepared by electrodeposition and increases their current densities in forward bias. Since the CV results suggest a similar band energy diagram for both the derivatized and underivatized samples, the improved junction characteristics and higher current densities are likely the consequence of an increase number of surface sites for interfacial charge transfer between the two phases rather than a difference in the electrical properties of the bulk phases. These charge transfer sites are a result of directly attaching the conducting polymer to the semiconductor surface through the prepared molecular film. This enhanced interaction between the semiconductor and polypyrrole provides allows improved charge transfer between the phases and results in better junction properties. In essence, the molecular film homogenizes the transition from the inorganic silicon phase to the electro deposited organic polymer. Further evidence for the improved interaction between the two materials is provided by noting that the presented surface modification of silicon yields polypyrrole films with a smoother morphology and better adhesion than on the native hydrogen-terminated silicon surfaces.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method comprising:
    providing a surface having at least a portion of the surface comprising $Si_xH_y$ units, wherein H is bonded to Si, x is greater than zero and y is greater than zero;
    exposing the at least a portion of the surface to an organometallic reagent comprising a metal selected from the group consisting of alkali metals alkaline earth metals, main group metals, transition metals, lanthanides and actinides; and
    forming a silicon-carbon bond at the at least a portion of the surface at a temperature of less than about 25° C. and free of an external energy source.

2. A method as in claim 1, wherein the carbon atom of the silicon-carbon bond is attached to a unit having at least one unsaturated carbon atom.

3. A method as in claim 1, wherein the organometallic reagent includes a metal selected from the group consisting of lithium, magnesium, copper and zinc.

4. A method as in claim 1, wherein the organometallic reagent includes at least one unsaturated carbon atom.

5. A method as in claim 1, wherein the forming step further comprises exposing the at least a portion of the surface to an organic halide, wherein the organic halide has at least one unsaturated carbon atom selected from the group consisting of alkenes, alkynes and aryls.

6. A method as in claim 1, wherein the surface is selected from the group consisting of a porous silicon surface and a crystalline silicon surface.

7. A method comprising:
    providing a surface having at least a portion of the surface comprising a formula $Si_xH_y$, wherein H is bonded to Si, x is greater than zero and y is greater than zero;
    exposing the at least a portion of the surface to an organometallic reagent comprising a metal selected from the group consisting of alkali metals alkaline earth metals, main group metals, transition metals, lanthanides and actinides; and
    forming a silicon-metal bond on the at least a portion of the surface.

8. A method as in claim 7, wherein the metal atom of the silicon-metal bond is provided from the organometallic reagent.

9. A method as in claim 7, wherein the organometallic reagent includes at least one unsaturated carbon atom.

10. A method as in claim 7, wherein the surface is selected from the group consisting of a porous silicon surface and a crystalline silicon surface.

11. A method as in claim 7, wherein at least a portion of the surface also includes a silicon-carbon bond.

12. A method as in claim 11, wherein the carbon atom of the silicon-carbon bond is attached to a unit having at least one unsaturated carbon atom.

13. A method as in claim 7, further comprising exposing the at least a portion of the surface to an organic halide reagent to form a silicon-carbon bond, wherein the organic halide contains at least one unsaturated carbon atom selected from the group consisting of alkenes, alkynes and aryls.

14. An article comprising a surface having at least a portion of the surface comprising a formula $Si_xH_{y-MXn}$, M being a metal, wherein H is bonded to Si, X is an anion, x is greater than zero, y is greater than zero and n is at least 0.

15. An article as in claim 14, wherein the metal is selected from the group consisting of lithium, magnesium, copper and zinc.

16. An article as in claim 14, wherein the surface is selected from the group consisting of a porous silicon surface and a crystalline silicon surface.

17. An article comprising semiconductor silicon comprising a surface wherein at least a portion of the surface has a silicon-carbon bond and the carbon atom of the silicon-carbon bond is attached to a unit having at least one unsaturated carbon atom.

18. An article as in claim 17, wherein the unsaturated carbon atom is selected from the group consisting of aryls, alkenes and alkynes.

19. An article as in claim 17, wherein the surface is selected from the group consisting of a porous silicon surface and a crystalline silicon surface.

20. A method comprising:

providing a surface having at least a portion of the surface comprising $Si_xH_y$ units, wherein H is bonded to Si, x is greater than zero and y is greater than zero; and forming a silicon-carbon bond at the at least a portion of the surface at a temperature of less than about 25° C. and free of an external energy source;

wherein the forming step comprises exposing the at least a portion of the surface to an organometallic reagent comprising a metal selected from the group consisting of lithium, magnesium, copper and zinc.

21. A method comprising:

providing a surface having at least a portion of the surface comprising a formula $Si_xH_y$, wherein H is bonded to Si, x is greater than zero and y is greater than zero;

exposing the at least a portion of the surface to an organometallic reagent comprising a metal selected from the group consisting of lithium, magnesium, copper and zinc; and forming a silicon-metal bond on the at least a portion of the surface.

* * * * *